(12) United States Patent
Garrou et al.

(10) Patent No.: US 7,902,639 B2
(45) Date of Patent: Mar. 8, 2011

(54) PRINTABLE ELECTRIC CIRCUITS, ELECTRONIC COMPONENTS AND METHOD OF FORMING THE SAME

(75) Inventors: Philip E. Garrou, Cary, NC (US); Michael R. Knapp, Emerald Hills, CA (US); Hash Pakbaz, Hayward, CA (US); Florian Pschenitzka, San Francisco, CA (US); Xina Quan, Saratoga, CA (US); Michael A. Spaid, Mountain View, CA (US)

(73) Assignee: Siluria Technologies, Inc., San Francisco, CA (US)

( * ) Notice: Subject to any disclaimer, the term of this patent is extended or adjusted under 35 U.S.C. 154(b) by 1147 days.

(21) Appl. No.: 11/280,986

(22) Filed: Nov. 16, 2005

(65) Prior Publication Data

US 2006/0254502 A1    Nov. 16, 2006

Related U.S. Application Data

(60) Provisional application No. 60/680,491, filed on May 13, 2005.

(51) Int. Cl.
*H01L 29/40* (2006.01)
(52) U.S. Cl. .......... 257/622; 257/623; 257/624; 257/625; 257/626
(58) Field of Classification Search ........... 257/622–626
See application file for complete search history.

(56) References Cited

U.S. PATENT DOCUMENTS

| | | |
|---|---|---|
| 5,695,810 A | 12/1997 | Dubin et al. |
| 5,830,805 A | 11/1998 | Shacham-Diamand et al. ............ 438/678 |
| 5,891,513 A | 4/1999 | Dubin et al. ............ 427/98 |
| 6,174,812 B1 | 1/2001 | Hsiung et al. |
| 6,207,392 B1 | 3/2001 | Weiss et al. ............ 435/7.1 |
| 6,235,540 B1 | 5/2001 | Siiman et al. ............ 436/518 |
| 6,277,740 B1 | 8/2001 | Goldstein ............ 438/660 |
| 6,417,340 B1 | 7/2002 | Mirkin et al. ............ 536/23.1 |
| 6,504,227 B1 * | 1/2003 | Matsuo et al. ............ 257/531 |
| 6,605,424 B1 | 8/2003 | Lefkowitz et al. ............ 435/4 |
| 6,638,564 B2 | 10/2003 | Segawa et al. |
| 6,646,345 B2 | 11/2003 | Sambucetti et al. |
| 6,723,600 B2 * | 4/2004 | Wong et al. ............ 438/244 |
| 6,774,036 B2 | 8/2004 | Goldstein ............ 438/660 |
| 6,780,765 B2 | 8/2004 | Goldstein ............ 438/660 |
| 6,797,312 B2 | 9/2004 | Kong et al. |
| 6,805,904 B2 * | 10/2004 | Anders et al. ............ 427/203 |

(Continued)

OTHER PUBLICATIONS

Bindra, P. et al., "Chapter 12 Fundamental Aspects of Electroless Copper Plating", American Electroplaters and Surface Finishers Society, 1990, pp. 289-329.

(Continued)

*Primary Examiner* — Matthew C Landau
*Assistant Examiner* — James M Mitchell
(74) *Attorney, Agent, or Firm* — Seed IP Law Group PLLC

(57) ABSTRACT

Improved methods and articles providing conformal coatings for a variety of devices including electronic, semiconductor, and liquid crystal display devices. Peptide formulations which bind to nanoparticles and substrates, including substrates with trenches and vias, to provide conformal coverage as a seed layer. The seed layer can be further enhanced with use of metallic films deposited on the seed layer. Seed layers can be characterized by AFM measurements and improved seed layers provide for better enhancement layers including lower resistivity in the enhancement layer. Peptides can be identified by phage display.

9 Claims, 18 Drawing Sheets

U.S. PATENT DOCUMENTS

| | | | |
|---|---|---|---|
| 6,821,324 B2 | 11/2004 | Shacham-Diamand et al. | |
| 6,887,297 B2 | 5/2005 | Winter et al. | 75/369 |
| 6,887,776 B2 | 5/2005 | Shang et al. | 438/612 |
| 6,897,151 B2 | 5/2005 | Winter et al. | 438/687 |
| 6,902,605 B2 | 6/2005 | Kolics et al. | |
| 6,927,113 B1 | 8/2005 | Sahota et al. | |
| 7,005,752 B2* | 2/2006 | Bojkov et al. | 257/786 |
| 7,084,060 B1* | 8/2006 | Furukawa et al. | 438/677 |
| 7,410,899 B2 | 8/2008 | Chen et al. | |
| 2002/0006468 A1 | 1/2002 | Paranjpe et al. | |
| 2002/0006723 A1 | 1/2002 | Goldstein | |
| 2002/0019123 A1* | 2/2002 | Ma et al. | 438/622 |
| 2002/0153551 A1* | 10/2002 | Wong et al. | 257/303 |
| 2003/0042609 A1* | 3/2003 | Choi | 257/758 |
| 2003/0068900 A1 | 4/2003 | Belcher et al. | 438/758 |
| 2003/0073104 A1 | 4/2003 | Belcher et al. | 435/6 |
| 2003/0113714 A1 | 6/2003 | Belcher et al. | 435/5 |
| 2003/0136813 A1* | 7/2003 | Magerlein et al. | 228/180.5 |
| 2003/0148380 A1 | 8/2003 | Belcher | 435/7.1 |
| 2004/0127640 A1 | 7/2004 | Belcher et al. | 525/54.1 |
| 2004/0171139 A1 | 9/2004 | Belcher et al. | 435/287.1 |
| 2004/0207093 A1 | 10/2004 | Sun et al. | |
| 2004/0238214 A1* | 12/2004 | Liu | 174/262 |
| 2004/0246692 A1* | 12/2004 | Satoh et al. | 361/782 |
| 2005/0014317 A1* | 1/2005 | Pyo | 438/184 |
| 2005/0064508 A1 | 3/2005 | Belcher et al. | 435/7.1 |
| 2005/0074968 A1* | 4/2005 | Chen et al. | 438/643 |
| 2005/0136193 A1 | 6/2005 | Weidman et al. | |
| 2005/0153547 A1 | 7/2005 | Barns | |
| 2005/0170336 A1 | 8/2005 | Belcher et al. | 435/5 |
| 2005/0180992 A1 | 8/2005 | Belcher et al. | 424/204.1 |
| 2005/0208754 A1* | 9/2005 | Kostamo et al. | 438/622 |
| 2005/0221083 A1 | 10/2005 | Belcher et al. | 428/364 |
| 2005/0245059 A1* | 11/2005 | Yuan et al. | 438/612 |
| 2005/0266698 A1 | 12/2005 | Cooney, III et al. | |
| 2006/0003387 A1 | 1/2006 | Peelle et al. | 435/7.2 |
| 2006/0083850 A1 | 4/2006 | Valverde et al. | |
| 2006/0084251 A1* | 4/2006 | Nakagawa et al. | 438/584 |
| 2006/0211236 A1 | 9/2006 | Bureau et al. | |
| 2006/0254503 A1 | 11/2006 | Dai et al. | |
| 2006/0280860 A1 | 12/2006 | Paneccasio, Jr. et al. | |
| 2008/0067679 A1 | 3/2008 | Takagi et al. | |
| 2008/0254205 A1 | 10/2008 | Petrov et al. | |

OTHER PUBLICATIONS

Jagannathan, R. et al., "Electroless plating of copper at a low pH level", IBM J. Res. Develop., vol. 37, No. 2, Mar. 2, 1993, pp. 117-123.

Brown, S., "Metal-recognition by repeating polypeptides", Nature Biotechnology, vol. 15, Mar. 1997, pp. 269-272.

U.S. Appl. No. 60/571,532, filed Apr. 17, 2004, Evelyn Hu.

Wong, S. et al., "Barrier/Seed Layer Requirements for Copper Interconnects", 1998 International Interconnect Technology Conference (San Francisco, CA), Jun. 3, 1998, pp. 1-3.

Ryu, C. et al., "Electromigration of Submicron Damascene Copper Interconnects", 1998 Symposium on VLSI Technology, Jun. 8-11, 1998, 2 pages.

Kohn, A. et al., "Evaluation of electroless deposited Co(W,P) thin films as diffusion barriers for copper metallization", Microelectronic Engineering, vol. 55, Nos. 1-4, Mar. 2001, pp. 297-303.

Smekalin, K. et al., "Tuning the process flow to optimize copper CMP", Solid State Technology, Sep. 2001, pp. 107, 108, 110 & 112.

Kohn, A. et al., "Characterization of electroless deposited Co(W , P) thin films for encapsulation of copper metallization", Materials Science & Engineering, A303 (2001), pp. 18-25.

Naik, R. R. et al., "Silica-Precipitating Peptides Isolated from a Combinatorial Phage Display Peptide Library", Journal of Nanoscience and Nanotechnology, V. 2, No. 1, Feb. 2002, pp. 95-100.

Kato, M. et al., "Substrate (Ni)-Catalyzed Electroless Gold Deposition from a Noncyanide Bath Containing Thiosulfate and Sulfite", Journal of the Electrochemical Society, vol. 149, No. 3, Mar. 2002, pp. C164-C167.

Naik, R. R. et al., "Biomimetic synthesis and patterning of silver nanoparticles", Nature Publishing Group, 2002, pp. 169-172.

Kohn, A. et al., "Improved diffusion barriers for copper metallization obtained by passivation of grain boundaries in electroless deposited cobalt-based films", Journal of Applied Physics, vol. 92, No. 9, Nov. 1, 2002, pp. 5508-5511.

Healey, J., "Current Technical Trends: Dual Damascene & Low-k Dielectrics", Threshold Systems, 2002, pp. 1-6.

Madou, M. J., "Metal Deposition", Fundamentals of Microfabrication, 2002, pp. 344-357.

Nagel, D. J., "Chapter 18 Technologies for Micrometer and Nanometer Pattern and Material Transfer", Direct-Write Technologies for Rapid Prototyping Applications: Sensors, Electronics, and Integrated Power Sources, Academic Press, 2002 pp. 557-701.

Mao, C. et al., "Viral assembly of oriented quantum dot nanowires", PNAS, vol. 100, No. 12, Jun. 10, 2003, pp. 6946-6951.

Flynn, C. E. et al., "Synthesis and organization of nanoscale II-VI semiconductor materials using evolved peptide specificity and viral capsid assembly", Journal of Materials Chemistry, Aug. 27, 2003, pp. 2414-2421.

Pinto, N.J. et al., "Electroless Deposition of Thin Metallic Films on Polymer Fibers Prepared Via Electrospinning", Polymer Preprints, vol. 44, No. 2, Sep. 2003, pp. 138-139.

Banerjee, I. A. et al., "Cu nanocrystal growth on peptide nanotubes by biomeralization: Size control of Cu nanocrystals by tuning peptide conformation", PNAS, vol. 100, No. 25, Dec. 9, 2003, pp. 14678-14682.

Mao, C. et al., "Virus-Based Toolkit for the Directed Synthesis of Magnetic and Semiconducting Nanowires", Fundamentals of Microfabrication the Science of Miniaturization, Second Edition, vol. 303, Jan. 9, 2004, pp. 213-217.

Levy, R. et al., "Rational and Combinational Design of Peptide Capping Ligands for Gold Nanoparticles", J. Am. Chem. Soc. 2004, 126, pp. 10076-10084.

Reiss, B. D. et al., "Biological Routes to Metal Alloy Ferromagnetic Nanostructures", American Chemical Society, Nano Letters, 2004, vol. 4, No. 6, published on Web Apr. 30, 2004, pp. 1127-1132.

Narasimhan, M., "Inline Process Control of Advanced Thin Films at 65 nm and Beyond", www.kla-tencor.com/magazine, Summer 2004, pp. 1-16.

Hu, C.-K. et al., "Effects of Overlayers on Electromigration Reliability Improvement for Cu/Low K Interconnects", IEEE 42$^{nd}$ Annual International Reliability Physics Symposium, Phoenix, 2004, pp. 222-228.

Okinaka, Y. "Chapter 15 Electroless Plating of Gold and Gold Alloys", pp. 401-420.

* cited by examiner

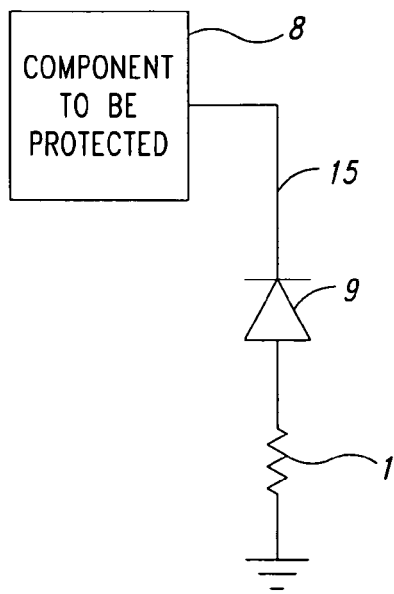
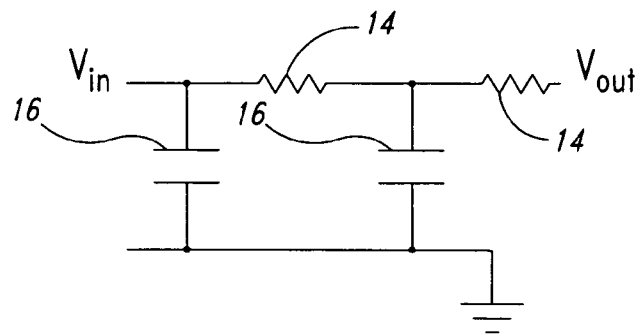
FIG. 1C
FIG. 1B
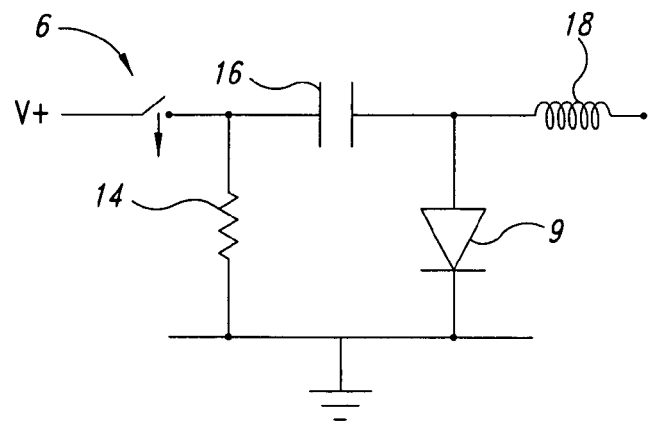
FIG. 1D
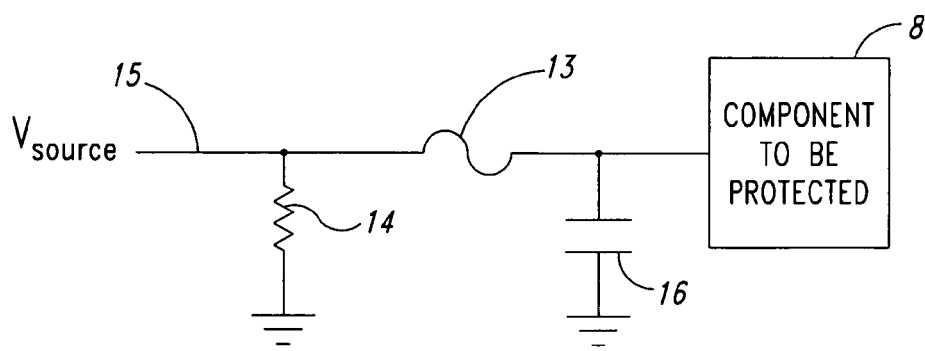
FIG. 1E

PRINTABLE ELECTRIC CIRCUITS, ELECTRONIC COMPONENTS AND METHOD OF FORMING THE SAME

STATEMENT OF GOVERNMENT INTEREST

This invention was made with government support under Contract No. 2004-H838109-000 awarded by the Central Intelligence Agency. The government has certain rights in this invention.

BACKGROUND OF THE INVENTION

1. Field of the Invention

This invention relates to electronic circuits that are formed by printing on a substrate, and more particularly, to a method of fabricating electronic circuits having active and passive components on any substrate by adhering to a seed layer that has been printed on the substrate.

2. Description of the Related Art

Substrates having electrically conductive lines thereon are used in a wide variety of electronic applications. Glass substrates used for LCD's, touch screens for visual displays, consumer electronic displays, from cell phone to portable computers all require electrically conductive lines to be formed thereon to provide the desired functionality. Flexible substrates are also used in a wide variety of applications, such as for the coupling of electronic components in a system or the transfer of data. Flexible substrates may be made of a polyimide film, such as Kapton, or from thin plastic or metal materials.

Epoxy resin is commonly used to laminate fiberglass layers to provide a substrate in various electronic components and computer systems. For example, the motherboard of the computer to which the CPU is coupled and electrically connected to other components on the motherboard is typically made from an epoxy resin laminate that includes one or more fiberglass layers. Memory boards, keypad support substrates, the interior electronic support boards of calculators, cell phones, flash disk drives and numerous other electronic components are typically mounted on such fiberglass epoxy laminate substrates.

The processing of such circuits requires numerous high temperature steps. The high temperature may not be compatible with other circuit components to be formed on the substrate.

Forming electrically conductive lines on various substrates presents particular technical challenges for each substrate. The techniques for forming the conductive lines and electronic circuits must be adapted to each particular substrate which often requires an initial investment, and technical changes or technology advancement. For example, placing an conductive circuit on glass, quartz and other rigid substrates requires very different equipment and handling techniques than can be used with fiberglass epoxy laminate, which are not as rigid. Similarly, forming electronic circuits on flexible substrates requires completely different machinery and equipment than can be used with glass or an epoxy laminate substrate.

An additional technical difficulty is the selection of different materials which can be formed on a particular substrate and the cost associated with using different materials for different substrates. For example, on some substrates aluminum can easily be formed as an electrical interconnection circuit. However, aluminum has a higher resistivity than other conductors, such as copper and gold. In addition, aluminum is not as suitable for forming certain electronic components such as capacitors and inductors as other metals and materials. It is therefore desired, in some substrates to provide electronic circuits having different types of metal for different functions, for example using copper and aluminum for certain electrical connection lines while using other materials such as metal oxides, dielectrics or magnetic metals for such components as resistors, capacitors and inductors, respectively. Yet the high-temperature steps, and etch chemistry for one material is often not compatible with other materials.

For example, many of these alternative elements are not compatible with the etch processes which are traditionally used for forming aluminum. Therefore, considerable expense is added to a simple electronic circuit if different materials are used. This requires substantial masking and etching followed by the appropriate clean and preparation steps for each different type of material.

For many types of materials it is common to deposit the entire material in a uniform film across the entire substrate. After the film is deposited, the layer is patterned by masking then developed and etched, each of which require movement of the substrate to different machines and some of which require complex chemistry which may affect other circuits or components if they have been previously formed on the substrate. This requires that protective layers be provided to cover previously formed layers while the deposition and etching is carried out on later prepared layers even though such layers may be electrically connected to each other.

Adding to the difficulty and expense is the need to manufacture different masks for each of the patterns to be etched in many of the processes today. For many electrical circuits formed on substrates today, once a pattern is determined, a mask must be formed which corresponds to the desired pattern. After the mask is formed, many circuits can be constructed with the same mask. If a change to the circuit is required, even of a very minor nature, a completely new mask is required with the attendant time and expense to obtain and implement such a mask before a layer in the new pattern can be formed on the substrate. Accordingly, the forming of custom electrical circuits on any given substrate is extremely expensive in the technology of today. The expense is amplified if a low number of the circuits are built, thus drastically increasing the cost per circuit.

BRIEF SUMMARY OF THE INVENTION

According to principles of the present invention, a method is provided for fabricating electronic components based on printing a seed layer on a substrate. The seed layer may be comprised of any combination of inorganic materials, biological materials, biomolecules or the like. After the printing of the seed layer, the substrate is exposed to a fluid, such as a liquid solution or a gas containing precursors to the material that is to form the electrically conductive layers. The seed layer has an affinity to the material in the fluid which causes the material to form on the seed layer and provides the growth of a desired conductive layer that corresponds to the location of the printed seed layer.

The present invention permits the printing of a pattern using any acceptable printing technologies in order to define an electronic circuit on any available substrate. Printing technologies permit a wide variety of different patterns to be easily and quickly created, at a low cost. Ink jet printers, laser printers and numerous other printers are software controlled and can provide a variety of different patterns for printing. Further, such printers are capable of easily printing on practically any available substrate. Therefore, a seed layer can be printed at relatively low cost in any desired pattern on any desired substrate after which, an electronic circuit is formed that conforms to the printed pattern. Many acceptable printing techniques may be used. In addition, lithography, flexo printing, gravure printing, screen printing, or other types of direct write printing are also acceptable.

The present invention is able to form the printed circuit without the need for etching, electroplating, masking, high temperature steps and various protective layers which are necessary for the forming of electronic circuits on substrates according to the current state of the art. In addition, the expensive equipment and capital investment required in order to form an electronic circuit on the given substrate is not necessary. The present invention provides for a very low cost formation of an electronic circuit using any standard printing technology and a liquid phase solution at room temperature.

A wide variety of substrates may be used for supporting the electronic circuit formed according to the present invention. Acceptable substrates include glass, quartz, an oxide, a plastic whether thick and rigid or thin and flexible. In addition, the substrate may be a ceramic, a polymer, a polyimide, a semiconductor or the like. In some embodiments, the substrate may be a conductor such as aluminum, stainless steel, copper, or a combination of semiconductors and conductors as may be present on a standard integrated circuit.

In a first embodiment, a substrate is used in which the seed layer will directly bond to the substrate without the need for additional coating or preparation. In such cases, the substrate would be cleaned, prepared and washed to provide an acceptable surface for the printing of the seed layer. For some seed layers, a coating of a preparation material on the substrate may be desired in order to provide solid bonding of the seed layer to the substrate. For example, the substrate may be coated with an ink having a selected chemistry which will bond to the seed layer. In other embodiments, the substrate may be coated with streptavidin which provides an affinity between a peptide and the substrate in the event a peptide is used as the seed layer. Other substrate coatings which provide bonding with a biomolecule may also be used such as a poly-lysine or a silane.

The seed layer is preferably composed of a biomolecule having desired properties. The biomolecule may be a simple protein or phage which has an affinity for the substrate at one site or end thereof and an affinity for the material to be formed on the substrate at another site or end thereof. The biomolecule may also include a variety of biological agents having desired properties. For example, peptides, whether natural or synthetic, amino acids, and other, more complex biomolecules may be used for the biological agent.

A biological agent may be selected which has an affinity for the substrate to which the seed layer is to be attached. Preferably, the biological agent also has an affinity for the material which is to be used in the electronic circuit being deposited on the substrate. Thus, a single biomolecule will bond with both substrate and the conductive material. In most cases, simple printing of the seed layer on the substrate is sufficient to bond the seed layer to the substrate without the need for the seed layer to have a biological affinity to the substrate. Many biomolecules adhere well to any surface based solely on the natural stickiness and low viscosity. When printed, the seed layer, such as a biomolecule, will adhere to the substrate based on the printing technique used and not based on a biological affinity. Thus, seed layers may also be used which do not have an affinity for the substrate but only have an affinity for the conductive material to be applied in a later step.

The biomolecule that is used will provide selective deposition on a layer that is specific to a layer of that material. The affinity of the biomolecule may be of the type that it provides selective deposition on only that material that forms the layer of interest. It is thus specific to that layer and does not form on other layers or materials.

For those cases in which a biomolecule does not have an affinity for the material to be formed in the electrical circuit, a sensitizer can be provided to the biomolecule. In such a circumstance, a solution is formed which includes a precursor material the biomolecule that is to form the seed layer. A sensitizer is added to the solution containing the precursor to the seed material. The sensitizer will combine with the seed layer material in order to form nanoparticles having the composition desirable to act as nucleation seeds for another material of choice.

Repeated printing of different patterns on the same substrate may also easily be carried out according to the present invention. A first pattern may be printed on the substrate after which a conductive material is attached by exposing the substrate to a solution containing a precursor to the conductive material. In a subsequent step, another pattern may be printed on the same substrate either to overlap, abut against or be spaced from the first pattern. The second pattern contains a seed layer with an affinity for a different material for forming different components of the electronic circuit. The substrate is then exposed to a solution containing precursors to the additional material, thus providing an electronic circuit composed of two materials which may be electrically connected to each other. Alternatively, the two seed layers can be formed on the substrate successively followed by exposure of the substrate to a solution containing both of the precursors. Because of the controlled affinity of seed A to precursor A and seed B to precursor B, the material deposition can be locally controlled by the seed deposition for different materials. The selective printing and depositing of other layers may continue for several different electronic components and to create electrical contact between various portions of the circuit.

According to one embodiment of the invention, a substrate is provided to receive a seed layer. A seed layer is printed on the non-conductive substrate in a selected pattern. The seed layer is selected to have an affinity to a material that will form a selected conductor that will be part of the electrical circuit. The substrate is then exposed to a solution containing a precursor to the selected conductor. The selected conductor becomes coupled to the substrate at locations containing the printed seed layer, thus forming electrical circuit components on the substrate. According to one embodiment, the seed layer is comprised of a plurality of biomolecules. The biomolecules may be selected from the group of amino acids, peptides, proteins, and the like. In one embodiment, the seed layer is comprised of a combination of a biomolecule and an inorganic member. The seed layer may include two or more layers. For example, it may include a base layer of an ink which has been positioned on the substrate. The seed layer has an affinity to the ink at one end thereof. The seed layer is applied to the substrate and links to the ink without a separate printing step.

According to a further embodiment of the present invention, a substrate is provided on which a plurality of passive components are formed. A first layer is positioned on the non-conductive substrate. The seed layer is formed in a selected pattern on the substrate and is placed on the substrate using standard printing techniques. The seed layer has an affinity for a preselected conductive material which is used to form one of the components of the electrical circuit. A first conductor which is composed of the preselected conductive material is coupled to the substrate at the locations containing the seed layer by being associated to the seed layer. This forms a first portion of the electrical circuit. A second seed layer is positioned at different locations on the non-conductive substrate, the second seed layer having an affinity for a second type of electrical material. The second electrical material may be adjacent to and electrically connected to the first conductive material in the final electronic circuit by placing the two seed layers adjacent to or overlapping with each other.

In some embodiments, the first conductive material is a conductor which has a low resistivity to act as a conductive trace in electrical circuit. Such conductors include copper and gold for example. The second electrical material may have a relatively high resistivity so as to act as a resistor in the electrical circuit. The material acting as the resistor may be a metal oxide, ceramic or any other acceptable materials. The patterns of the first and second seed layer are selected to form an electrical circuit having the desired electrical properties for conductors, resistors, capacitors, inductors and the like.

According to one embodiment, the seed layer is printed in a pattern so as to form a comb capacitor on the substrate. The comb capacitor includes inter-digitized fingers of conductor adjacent to each other arranged in a manner well known in the art. Alternatively, a stacked capacitor may be formed by subsequently forming seed layers on top of previously provided conductive layers and then exposing the substrate to an additional electrical material so as to form a second layer on top of the first conductive layer. For example, a stacked capacitor may be formed composed of a conductor, a dielectric, and then another conductive layer by performing subsequent forming of seed layers on top of a previously formed conductive or electrical circuit component layer.

In one preferred embodiment, the additional seed layers are formed without the need for printing onto the previously formed conductor. In this preferred embodiment, a seed layer is selected which has bi-functional affinity. A seed layer is selected having different components that have an affinity to the conductive layer which has previously been formed on the substrate following the first printing. Another portion of the seed layer has an affinity for the second material which is subsequently to be provided on the substrate. According to this embodiment, the substrate is merely exposed to a fluid containing the bi-functional seed layer which will attach itself to those portions of the previously formed electronic circuit for which it has an affinity and will not attach to the other portions of the substrate or electronic circuit. The substrate is then removed from the fluid and washed leaving a new seed layer which has been self formed only on those particular portions of the previously existing electronic circuit for which it has an affinity. Subsequently, the substrate is then exposed to a fluid containing an additional electrical material, such as a dielectric or another conductor which has an affinity for the seed layer which has just been formed. The conductor will then self attach to and deposit on the existing seed layer. This results in a stack of seed layers and electrical components in a known pattern in which only a single printing has been carried out.

Thus, according to the present invention, a single printing step may be used to form a plurality of self-aligning and self adhering layers based on a single pattern to form a stacked electrical component layer.

In one embodiment, the bi-functional seed layer may include a biomolecule such as a protein having an affinity at one site thereon for the existing conductive material and another site on the protein having an affinity for the future electrical material to be provided on the substrate.

Proteins having numerous affinity sites are known in the art today. Proteins can be engineered which have numerous affinity sites for selected electrical materials. Accordingly, various proteins can be engineered in order to provide the desired bi-functional seed layers according to principles of the present invention. Many different biomolecules may be used for the bi-functional seed layer such as phages, peptides, amino acids and the like.

According to one embodiment of the present invention, a seed layer comprises a peptide and nanoparticles. The peptide is a biomolecule while the nanoparticles may be an inorganic material such as copper, silicon and the like. The peptide will include at least one binding moiety for binding to the nanoparticles and also a binding moiety for the substrate. Accordingly, the present invention will include a seed layer deposed on the substrate, the seed layer comprising a peptide and a nanoparticle and an electrical material film disposed on the seed layer so as to be coupled to the substrate.

In some embodiments, it will be desired to remove the peptide following the formation of the seed layer before forming the first conductive material. The peptide may be removed by annealing, ashing, denaturing, or other techniques in order to substantially remove the biomolecule and leaving the linking portion of the seed layer on the substrate. The conductive material is then formed directly coupled to the remaining portions of the seed layer and being firmly coupled to the substrate. Accordingly, once the seed layer has been successfully completed the biomolecule can be volatized and removed so that it cannot be detected in the final conductive material. Thus, according to one embodiment of the present invention there is a substantial removal of the biological material prior to the completion of the electrical circuit so that an electrical circuit is provided having high quality metal films and electrical components without the presence of a biomolecule.

The present invention provides the advantage of permitting low cost electrical circuits to be formed on any available substrate. In addition, relatively low investment capital is required in order to form the electrical circuit. The electrical circuit can be formed in any desired pattern and then changed very easily at little to no additional cost. This permits the formation of low cost electrical circuits for a wide variety of applications where such circuits are either not available, or, if available have a high cost for forming. Such uses include touch screens, flat panel displays, LCDs, organic LEDs, plasma displays and the like. The uses may also include photovoltaic cells, an area heated glass, and other hard substrates. Additional uses include aircraft surfaces, whether for the heads up display or for providing specific electrical properties on aircraft structures such as titanium or aluminum. The present invention is also useful for forming electronic circuits for ESD and EMI protection as may be necessary for the packaging for shipping chips, circuit boards, and other electronic components. Thus, numerous types of packaging material may be printed with circuits according to the present invention. Other uses include electro luminescent circuits which may be printed on a variety of different substrates.

BRIEF DESCRIPTION OF THE DRAWINGS

FIG. 1B illustrates an ESD or an EMI protection circuit formed according to principles of the present invention.

FIG. 1C illustrates a simple capacitive filter network formed according to principles of the present invention.

FIG. 1D illustrates a simple capacitive inductor circuit with a switch and a protection diode formed according to principles of the present invention.

FIG. 1E illustrates a fuse in a power line to protect a selected component according to the principles of the present invention.

DETAILED DESCRIPTION OF THE INVENTION

Figure 1A:
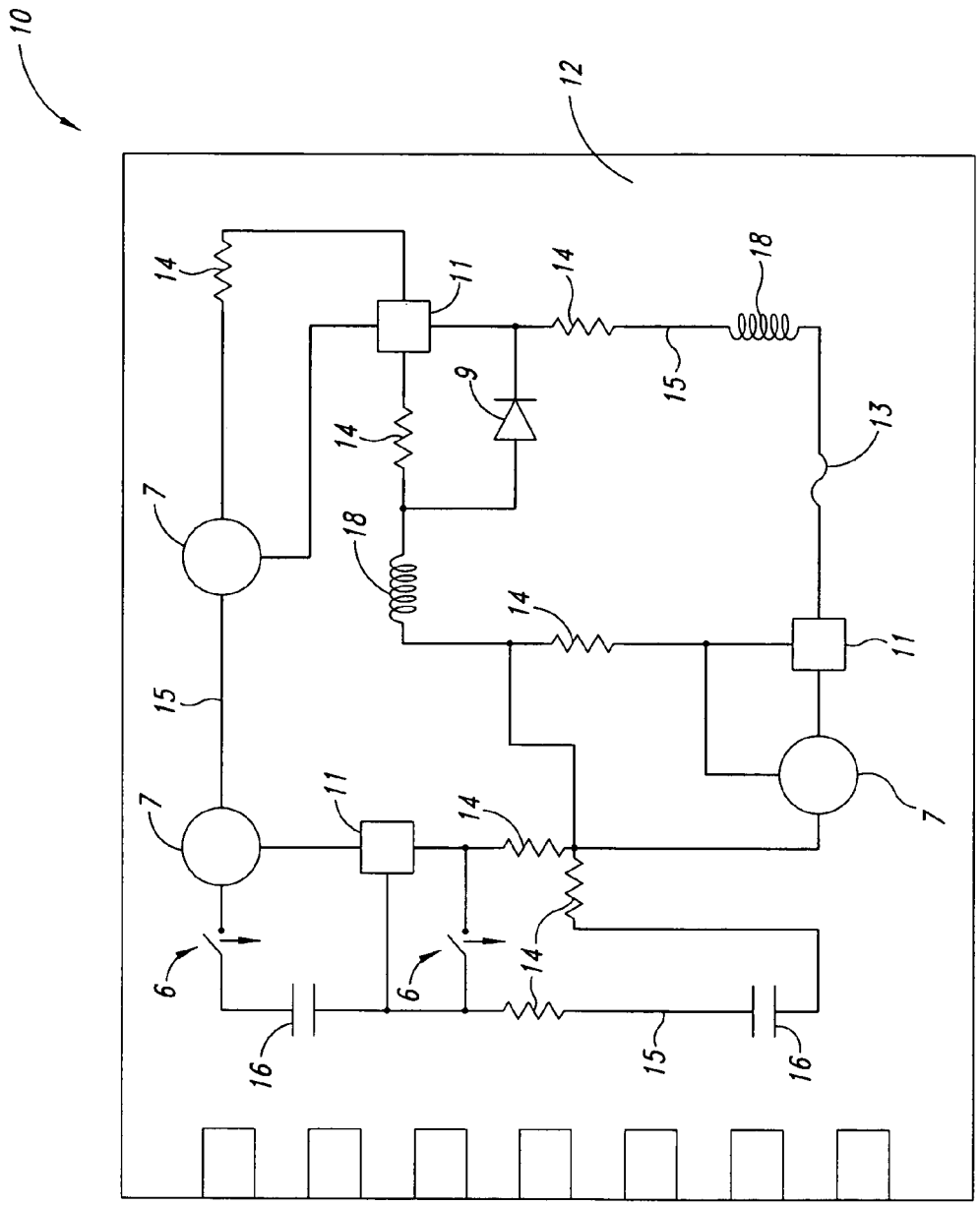
FIG. 1A is a schematic view of an electrical circuit formed on a substrate according to principles of the present invention.

FIG. 1A illustrates examples of various components that can be formed in a circuit 10 which has been constructed according to principles of the present invention. The circuit 10 includes a substrate 12 having an electrical connection which includes a variety of electrical components. Passive components may include fuse 13, resistors 14, capacitors 16, and one or more inductors 18. In some embodiments, only passive components are provided on the printed circuit. In other embodiments, one or more active components may be included on the circuit. The active components which may be included are a diode 9, or various other active components 7 and 11 which may be selected according to the needs of a particular circuit.

The circuit presented in FIG. 1A is provided for illustration purposes to demonstrate the variety of electrical components which can be electrically coupled to each other according to principles of the present invention and is not intended to illustrate the actual electrical connections of an operational circuit. FIGS. 1B-1G illustrate various useful circuits made according to principles of the present invention that can have any desired layout and any combination of various resistors, fuses, diodes or capacitors. Further, RC filters, CL tank circuits, or any combination of components may be connected together to form an electronic circuit.

In one embodiment of the invention, the electronic circuit provides an interface to a plurality of semiconductor chips mounted on the substrate 12. For example, permitting one or more of the integrated circuits to be electrically connected to each other on the substrate.

FIG. 1B illustrates a simple ESD or EMI protection circuit which can be constructed using the structures and method of the present invention. In this circuit, a component to be protected 8 is coupled to ground via a diode 9 which is configured in reverse bias mode. A resistor 14 may be positioned in the circuit as well. The diode 9 is connected reverse biased so as to be nonconducting during all normal operation of the component 8. In the event a voltage spike or other transient conditions occurs on the component 8, the diode 9 will be reverse-biased, shorting across itself and providing a direct link to ground. This will permit the voltage to discharge very quickly so as to protect the component 8. The resistor 14 is optional, and may or may not be present depending on the amount of current to be drained by respective voltage spikes to provide additional protection for conductor 15 and limit the amount of current which can be carried during discharge of the ESD event. Such a circuit may be useful on packaging of integrated circuits so as to provide discharge of any static electricity. It may also be provided on numerous other circuit boards or different sites where EMI is protection or ESD protection is desired of a particular component. Currently, ESD protection of glass substrates such as the type used in LCD displays is limited solely to passive components and is somewhat difficult to fabricate. According to principles of the present invention, the current ESD protection circuit can be easily fabricated on a glass substrate so as to provide appropriate ESD protection for the leads and components formed on the glass substrate. This provides safety protection for the types of circuits which would be used in touch screens, LCD displays, large plasma displays and other consumer electronics products where glass substrates carry conductive traces. The voltage at which diode 9 becomes reverse-biased, as well as its size and current carrying capability can be designed according to each particular need as is known in the art.

FIG. 1C illustrates a simple low pass filter made according to principles of the present invention. Capacitors 16 are placed in parallel to each other and in a series path with the voltage signal to ground. High frequency signals will be shorted through the capacitor 16 while low frequency and DC voltages will pass unchanged from $V_{IN}$ to $V_{OUT}$. The size of the capacitors as well as their relationship to each other and resistor 14 can be selected to provide the desired filtering capability using principles well known in the art.

FIG. 1D illustrates a capacitor-inductor circuit with a switch 6 according to principles of the present invention. The switch 6 may be opened or closed in order to provide voltage to capacitor 16. As the switch is opened and closed, charge is transferred from capacitor 16 to inductor 18 on a selected cycle. The diode 19 is provided as a protection element so that in the event the threshold of the diode is exceeded the current is discharged to ground rather than causing damage to the inductor or the capacitor.

FIG. 1E illustrates a fuse 13 in a series connection to a component 8 to be protected. A source of voltage which is the main power source for the component to be protected is provided on line 15 to the component. The fuse provides full current carrying capability as needed for the component 8. A buffer capacitor 16 is also provided to hold the voltage at the appropriate level on the component 8 in the event of a short draw of power to act as a safety for fuse 13. In the event the component 8 begins to draw a large amount of power for an extended period of time, the fuse 13 will break the link, disconnecting the component 8 from the voltage source. The size of the capacitor 16, as well as the size and breaking point of the fuse 13 are selected based on the component 8 to be protected in order to provide the desired protection capability. Alternatively, a resistor 14 may be provided so that in the event the fuse 13 breaks, a high resistance to ground is provided for the voltage source so that a large current is not consumed immediately, but some indication is provided that the fuse has blown. The resistor 14 may therefore be treated as a sense resistor so that rapid changes of the current passing through it may be indicative of the fuse 13 having been broken. Use of the capacitor 16 is optional depending on the type of component 8 to be protected.

Figure 1F:
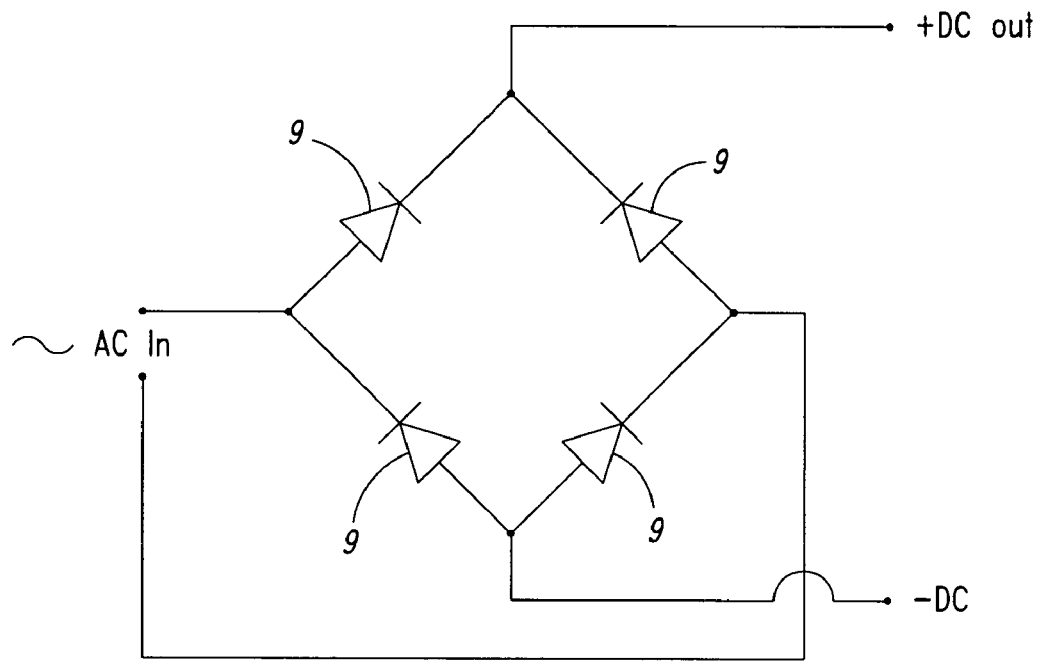
FIG. 1F is a diode bridge circuit for converting AC power to simple DC power formed according to principles of the present invention.

FIG. 1F illustrates a diode bridge composed of a plurality of diodes 9. The diode bridge converts an AC power to a DC output according to electrical principles well known in the art. An electrical circuit printed according to the present invention permits the use of diode bridges on a glass, plastic or other substrate without the use of integrated circuit components. Previous to this invention, the formation of active components such as a diode bridge on glass or plastic substrates using standard printing techniques was not easily achievable. With the present invention, a diode bridge as shown in FIG. 1F can be provided at very low cost on any known substrate in order to be linked with any other component which may be on the substrate whether the substrate be glass, plastic, fiberglass, epoxy resin laminate or the like. While the overall efficiency and quality of the AC to DC diode bridge may be slightly less than would be provided with a standard integrated circuit fabricated using a multi-billion dollar semiconductor processing facility it does provide a basic DC output which may be useful for basic circuits which may be formed on glass or plastic substrates and thus avoid the use of the purchase and fabrication of semiconductor components attached to such substrates. Thus, the entire active circuit may be made solely on the glass substrate using such components as the diode 9 of FIG. 1F and the switch 6 as shown in FIG. 1D either alone or in various combinations with each other.

Figure 1G:
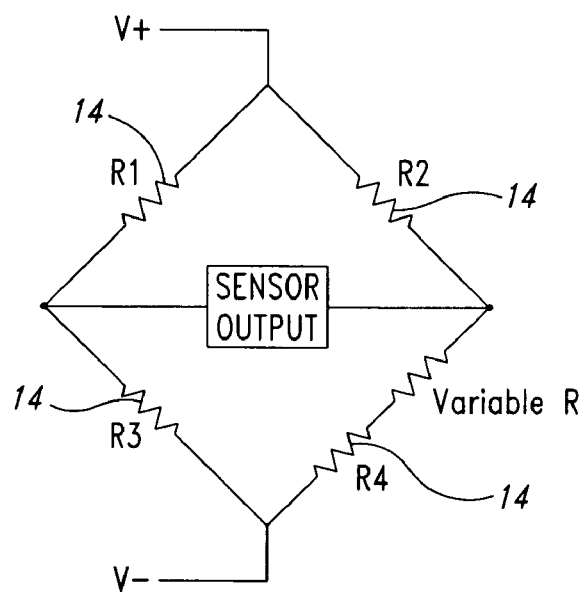
FIG. 1G is a Wheatstone bridge which may act as a sensor constructed according to principles of the present invention.

FIG. 1G illustrates a plurality of resistors 14 formed in a Wheatstone bridge pattern. A Wheatstone bridge is a well known sensor in the art and has many uses including for such features as a strain gage, an environmental sensor, and the like. Resistors formed according to principles of the present invention may be placed in the pattern of a Wheatstone bridge with the variable resistance R positioned appropriately in the circuit. The variable resistor arm may be exposed to certain environmental conditions, such as the exhaust gas of an internal combustion engine, a strain gage on the glass substrate of a plasma display to sense distortion or twisting of the plasma display, or various other locations where changes in an external, physical component will cause a change in the resistance of a variable resistor R. A sensor output, whether a simple signal indicating a threshold has passed or an actual readable output is provided indicating changes in the variable resistor. The Wheatstone bridge of FIG. 1G illustrates the useful circuit which can be made using purely passive components on a given substrate. At a very low cost, a user is able to construct a variety of electrical circuits, such as the Wheatstone bridge which may be formed on any substrate selected by the user from plastics to glass to metal aircraft parts to packaging. The sensor output can be a material which will change from a first color to a second color if the variable resistor R changes by a certain value, thus providing an indication at some later time in the product's lifecycle that a certain environmental condition has occurred such as exposure to a gas or an excessive strain. Thus, in one preferred embodiment the sensor output is a material whose color will change upon application of a slight voltage thus providing an easy and instantaneous signal to the end user that the condition being tested has occurred. Such a sensor would have wide application in a wide variety of components of consumer products which are shipped for assembly in other locations. The manufacture, upon simply viewing the sensor output on the various components may very easily see whether or not there has been excessive strain on each individual component such that it should be discarded rather than assembled into the final product. Such testing can be done by machine sensing as part of the robotic assembly of such components into a final end product. This assures the manufacturer that all of the components being placed into the end consumer product have not undergone excessive strain so as to break some of the individual elements of the component. Of course, numerous other uses of the Wheatstone bridge may also be carried out using a circuit constructed according to principles of the present invention.

Figure 2:
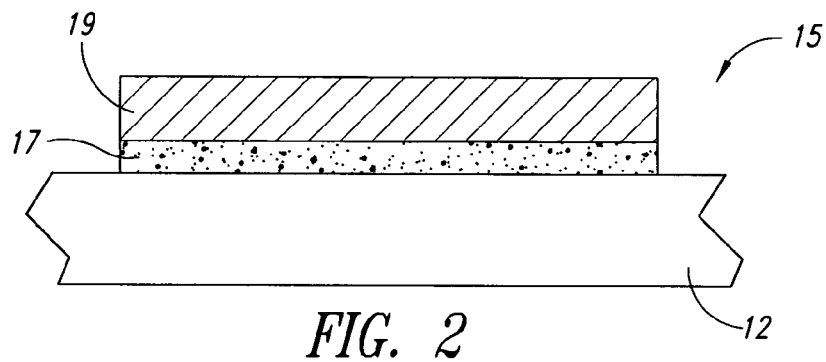
FIG. 2 is a side cross-sectional view of a conductive trace from FIG. 1.

FIG. 2 is a cross-sectional view of a conductive trace 15 of the type shown in the printed circuit in FIG. 1. The conductive trace 15 includes a seed layer 17 and a conductive material 19. The seed layer 17 is printed on the substrate 12 as explained in more detail herein. The conductive material 19 adheres to the seed layer 17 by placing the substrate 12 having the seed layer 17 thereon in a fluid having a precursor in the fluid for the conductive material 19. This results in a formation of conductive trace 15 at those locations where seed layer 17 has been printed for the electrical circuit 10 as shown in FIG. 1A. The conductive material 19 may be composed of copper, or any other desirable alternative for providing a conductive trace. For example, gold, silver, palladium, platinum, or other highly conductive materials may be used for the conductive material 19.

The pattern 17 is not printed at other locations on the substrate 12 where a conductive trace is not desired. Accordingly, when the substrate 12 is placed within a carrier fluid, such as by being dipped into a solution or exposed to a gas, containing the precursor to the material 19, the conductive layer 15 is only formed on a top of the patterned seed layer 17. At other locations on the substrate 12, the conductive material 19 does not adhere to the substrate. Therefore when the substrate 12 is removed from the solution the conductive material 19 is not present at such locations. The substrate 12 can then be washed and rinsed to ensure that the top surface is completely clean of all material where the seed layer 17 is not present and that the conductive material 19 forming the conductive trace 15 is present at those locations. In this example, the material 19 will be selectively deposited onto the seed layer 17. Even though the entire substrate is exposed to the fluid containing the precursor to material 19, the seed layer is selective so that the material 19 will be specific to that type of seed layer to be selectively deposited only on the layer 19 and will not be deposited on the substrate or on other seed layers is some happen to be present. A simple washing in the appropriate solvent, which may be water, an alcohol, etc. will remove the carrier fluid, which includes material 19 from all locations on the substrate expect those to which has been selectively deposited.

Figure 3A:
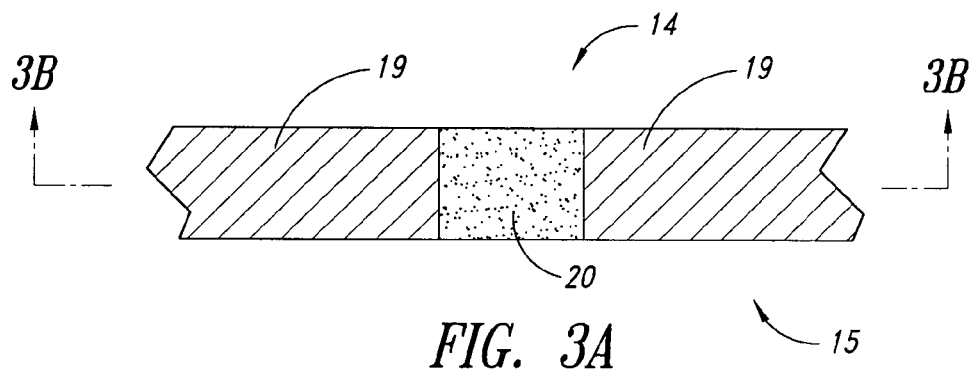
FIG. 3A is a top view of a resistor from the circuit of FIG. 1.

FIG. 3A is an enlarged view of a resistor 14 as formed in the printed circuit of FIG. 1. The resistor 14 includes a resistance material 20 having a low conductivity. The resistance material 20 is electrically coupled to the conductive material 19. The type of material for the resistance layer 20 as well as its length, width, and thickness are selected to provide a desired resistance. Any known material used for resistors today is acceptable for use as the material of the resistor 20. Acceptable examples of such materials includes a number of metal oxides, for example $RuO_2$, $Bi_2Ru_2O_7$, including various combinations of oxides with other materials. The resistor material 20 may also be a ceramic, a plastic, a polymer film, a metal, a metal alloy or other acceptable material. The resistor may also be obtained by having the resistive material a selective length, such as by a serpentine type of resister.

Figure 3B:
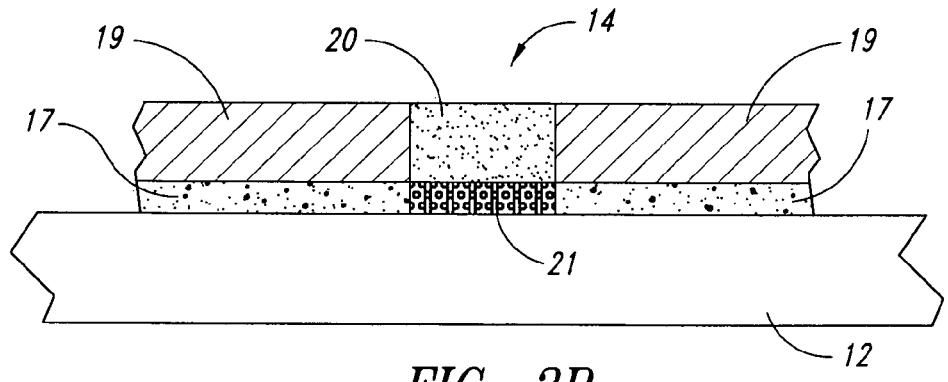
FIG. 3B is a cross-sectional view taken along lines 3B-3B from FIG. 3A.

FIG. 3B illustrates the resistor 14 coupled to the conductive trace 15 from FIG. 3A along lines 3B-3B. The resistor 14 is on the substrate 12 and is coupled via a seed layer 21. The seed layer 21 has an affinity for the material selected for the resistor 20. Accordingly, the seed layer 21 will be customized based upon the known material to be used for the resistor 20 so that this material will be selectively deposited on the seed layer 21 and not on the conductor. If a different material for resistor 20 is desired, a different seed layer 21 may be selected having an affinity for such material so that the electrical circuit can be formed according to principles of the present invention. As explained in more detail later herein, a sensitizer can be added to the seed layer 21 to provide the appropriate affinity to a precursor for the material 20. The sensitizer may be a biomolecule or other biological material, such as a peptide, amino acid, phage protein, etc.

Figure 3C:
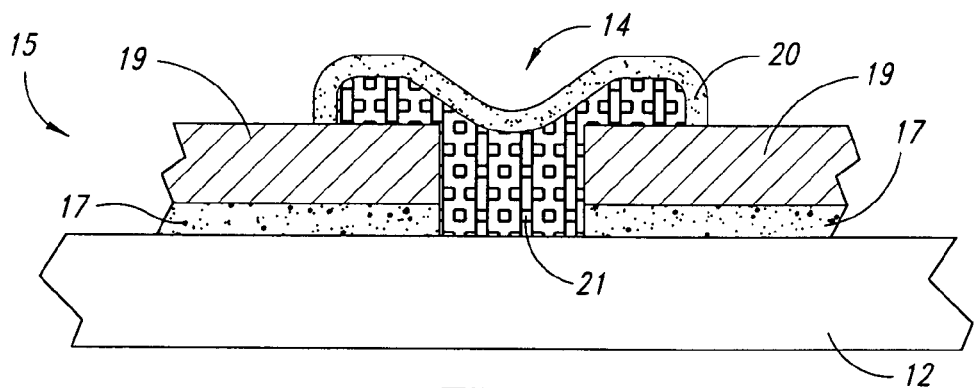
FIG. 3C is a cross-sectional view of an alternative embodiment of a resistor from FIG. 1.

FIG. 3C illustrates an alternative embodiment of a resistor 14 according to principles of the present invention taken along lines 3B-3B of FIG. 3A. In this embodiment of the resistor 14, the resistor overlays the edges of two adjacent conductors 19 forming the conductive trace 15. In some embodiments, abutting contact between the resistive material 20 and the conductive material 19 is desired as shown in FIG. 3B. For alternative types of resistors, a resistor bridge that is in electrical contact with the top surfaces of respective layers 19 may be desired as shown in FIG. 3C. One advantage of the embodiment of FIG. 3C is that less strict design rules and greater tolerances are permitted for the formation of the resistor. If some overlap is permitted, then printing may proceed of the various seed layers 21 and 17 without concern for precise alignment which may be advantageous in some embodiments.

Figure 4A:
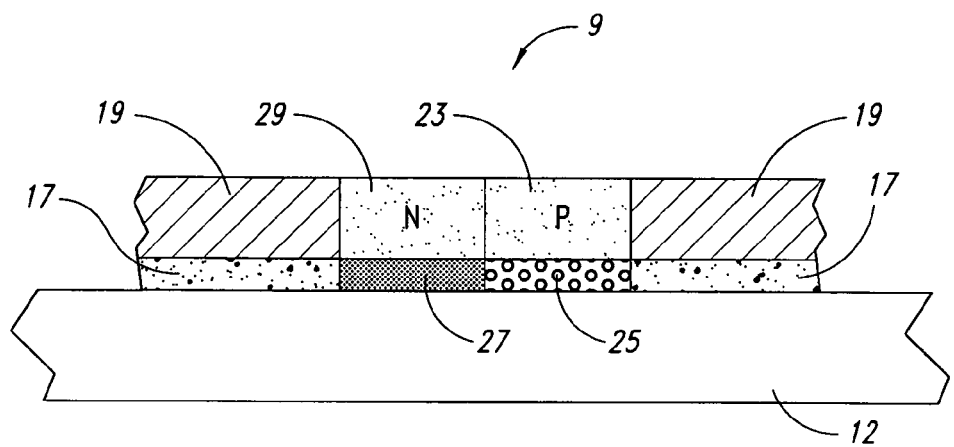
FIG. 4A illustrates a PN junction diode from FIG. 1 which has been constructed according to principles of the present invention.
Figure 4B:
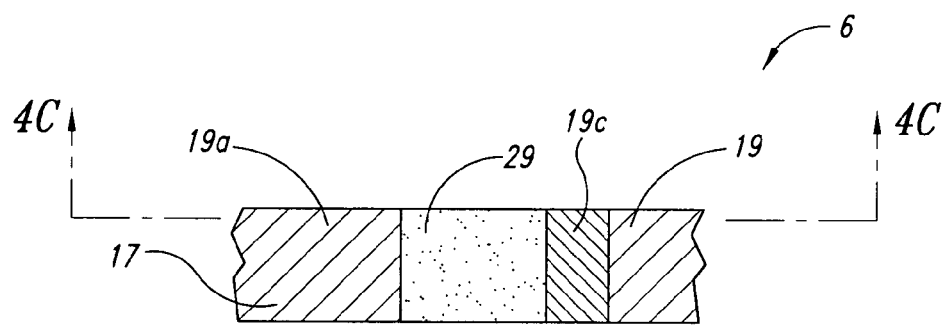
FIG. 4B illustrates a Schottky diode according to principles of the present invention.
Figure 4C:
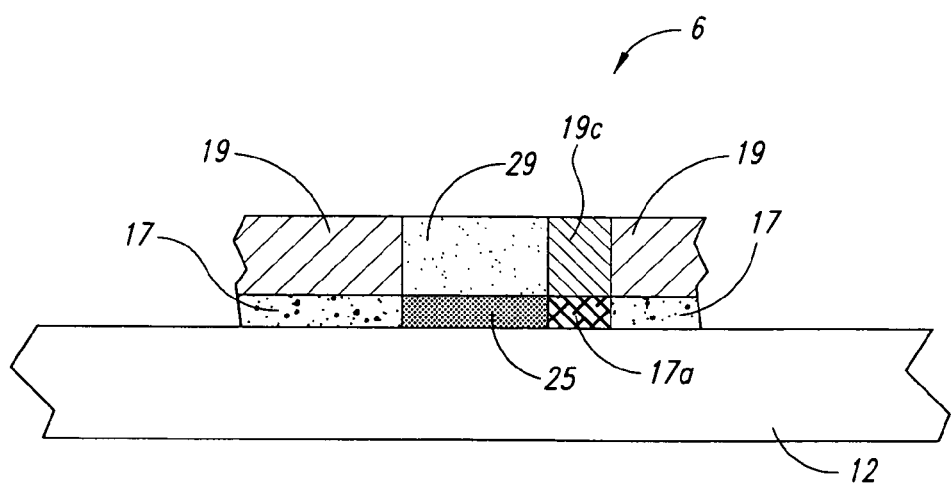
FIG. 4C is a cross-sectional view of the switch of FIG. 4B taken along the lines of 4C-4C.

FIGS. 4A-4C illustrates various passive and active components which may be formed according to principles of the present invention. In FIG. 4A, seed materials 25 and 27 are printed on the substrate in a manner similar to that shown as described with respect to the resistor and other components herein. Thereafter, the substrate 12 is exposed to a fluid containing a semiconductor material. In one embodiment, it may be appropriately doped and have an affinity for the respective seed layers 25 and 27.

The construction of the diode 9 may be carried out as follows. The seed layer 25 may be a phage or peptide having an affinity for silicon. After the seed layer 25 has been printed on the substrate at the appropriate location, the substrate 12 is exposed to a fluid containing a precursor to silicon. In addition, the silicon might be of the type which includes boron already in the lattice structure or, some boron may be in the fluid as well so that as the silicon adheres to and attaches to the seed layer 25, a small amount of boron is introduced into the lattice structure of the silicon, forming a P-type region 23 of semiconductor material. Other semiconductor materials besides silicon may be used, such as gallium arsenide, germanium and the like, each of which may be appropriately doped P-type as is known in the art. Subsequently, a seed layer 27 is printed on the substrate at the appropriate location as shown in FIG. 4A. The substrate 12 is then exposed to a fluid which contains silicon or other semiconductor material which has an affinity for the seed layer 27. The silicon in this fluid may itself previously be doped N-type, or in the alternative the solution may include small molecules which have N-type doping, such as, for example arsenic or phosphorus. The semiconductor material having an affinity for the substrate layer 27 will attach itself to the seed layer while also having a small amount of N-type doping within the lattice structure, thus forming an N-type semiconductor region 29 as shown in FIG. 4A. In some embodiments, the very same seed layer may be used for 25 and 27, the difference being the solutions in which they dipped having a precursor either for P-type silicon or N-type silicon. In alternative embodiments, the seed layers might be customized so as to have a greater affinity for a P- or N-type doped semiconductor material.

After the substrate 12 has been removed from the various solutions, a diode 9 has been formed by the junction between the N- and P-type semiconductor materials. Thus, a PN junction has been formed on the substrate 12 by the simple dipping of the substrate into respective solutions containing the appropriate precursors at room temperature. Room temperature is generally in the range of 20 to 30 degrees centigrade and is considered a low temperature. Generally, any temperatures at or below 100 degrees centigrade and above 0 degrees centigrade would be consider low temperatures since this temperature range can easily be achieved and maintained by standard equipment, It desirable to have the temperature above the freezing temperature of the liquid being used since this will make handling and use easy. Of course, the liquid might be stored at 3 to 5 degrees centigrade for long term storage. It can be warmed to room temperature for use if desired. This permits the formation of diode 9 in the conductive trace which may be used in such circuits in the circuits as shown in FIGS. 1A, 1B and 1D. The diode will have the electrical properties based on the doping concentration of the respective P- and N-layers as well as their thickness and printed location as defined by the pattern which has been printed of seed layers 25 and 27. Accordingly, a voltage applied to one of the conductive traces 19 may be either blocked or passed by the diode depending on its respective threshold voltage and its breakdown voltage and the forward bias and reverse bias of the diode.

Diodes formed according to principles of the present invention may be useful on a wide variety of substrates which previously required the use of integrated circuits to provide such an active component. Glass, plastic, polyamide and other substrates may have such diodes formed thereon which provide interactions with the conductive traces, such as ESD protection for other purposes as previously described.

FIGS. 4B and 4C illustrate a Schottky diode constructed according to the present invention. The Schottky diode has a metal and semiconductor junction and is constructed using similar steps to those used for the semiconductor diode of FIG. 4A. In particular, a metal trace 19 is formed as previously described and a semiconductor seed layer 25 is printed adjacent to the conductive trace 19. A semiconductor material 29 adheres to the seed layer 25 and is adjacent to the conductive trace 19, thus forming a Schottky diode. The semiconductor can be silicon, germanium, gallium arsenide, or other acceptable material. To construct a Schottky diode, a metal 19c, is formed on the substrate using the appropriate seed layer 17a based on the principles taught herein. The metal 19c is a different metal from the metal 19, such as aluminum if 19 is copper. A seed layer 17a having an affinity for aluminum is printed at the appropriate location on the substrate and then the additional metal 19c, such as aluminum is formed thereon. The Schottky diode is thus formed by this configuration.

Figure 5:
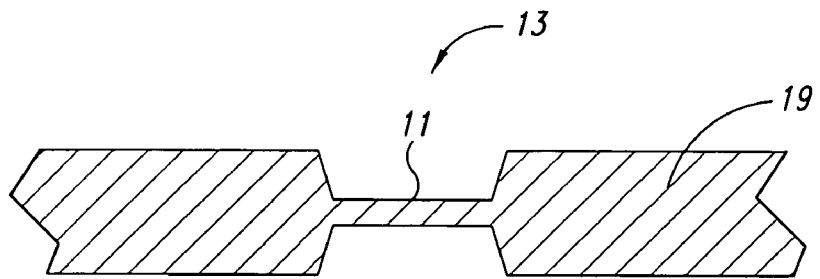
FIG. 5 is a top view of a fuse from the circuit of FIG. 1.

FIG. 5 illustrates an embodiment of fuse 13 having a link 11. In this embodiment, the fuse is formed merely by a narrowing link 11 of the conductive strip 19. Fuses formed by this technique usually have a breaking or melting point based on their geometry, and may be desired for those circuits in which some safety is required to protect a particular component. The fuse link 11 may have any selected thickness to provide safety for the system while having a low resistance to pass power to the system.

Figure 6A:
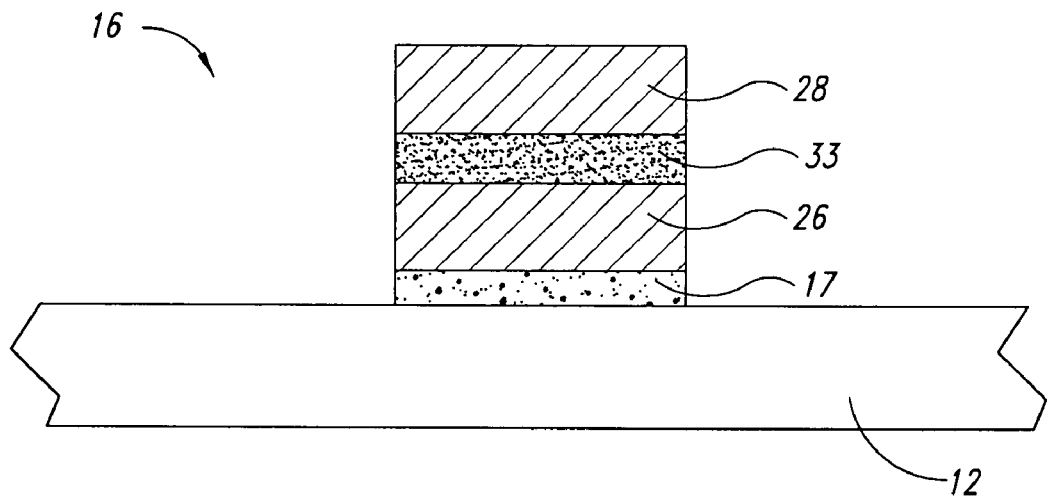
FIG. 6A is a cross-sectional view of a capacitor from the circuit of FIG. 1.

FIG. 6A illustrates a first embodiment of a capacitor 16 formed according to one embodiment of the present invention. FIG. 6A illustrates a stacked capacitor on substrate 12. In the stacked capacitor 16, a first seed layer 17 is coupled to the substrate 12 and a conductive layer 26 coupled to the seed layer 17. The conductive layer 26 forms a first plate of the capacitor. A bi-functional sensitized layer 33 is coupled to the conductor 26. The layer 26 is composed of any acceptable material having an affinity for the conductor 26 and also having additional properties as desired for the particular capacitor 16. For example, the bi-functional layer 33 may have a selected or known dielectric constant, thus providing some dielectric functions for the capacitor 16. It will also adhere to a second conductive layer 28 to be formed on top of the bi-functional sensitized layer 33, the layer 28 forming a second plate of the capacitor. The material selected for the dielectric can be one of many acceptable dielectrics, such as an oxide, a nitride, a titanate, barium titanate, silicon dioxide, silicon nitride, or any other acceptable dielectric nanoparticle.

Figure 6B:
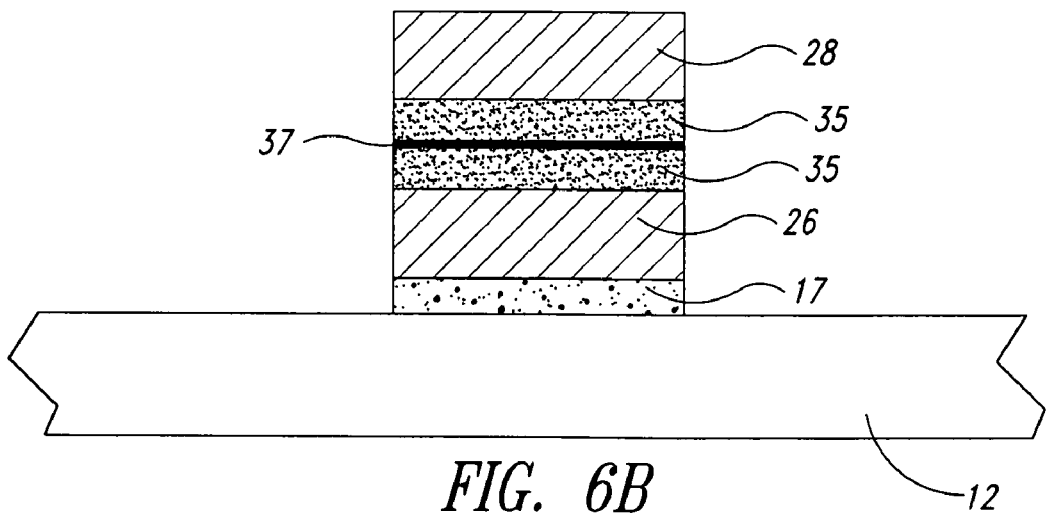
FIG. 6B is an alternative embodiment of a capacitor from the circuit of FIG. 1.

FIG. 6B illustrates another alternative embodiment of the stacked capacitor 16. It may include a seed layer 17 on top of which is formed a first plate 26. A bi-functional seed layer 35 is formed on the conductive layer 26 on top of which is formed a material 37 having a high dielectric constant. The bi-functional layer 35 is selected to attach at one site thereof to the conductor 26 and to have an affinity at the other site thereof to a material 37 having a desired dielectric constant and dielectric properties. A second bi-functional layer 35 is positioned on top of dielectric constant 37. A conductive plate 28 is thereafter formed on the bi-functional layer 31. This sequence of steps can be repeated a plurality of times to form a column having a plurality of stacked capacitors. For example, another seed layer 35 may be formed onto top conductive plate 28. The seed layer 35 is then used to form, either by itself or in combination with nanoparticles, a dielectric layer, on top of which is then formed another conductive layer to create a second capacitor on top of the first capacitor. This process can be repeated as many times as desired to form a stack of a plurality of stacked capacitors. A stack of about 60 capacitors would be an expected number of the thin film capacitors to be formed in this manner in one embodiment, while in other embodiments, the number could range from as few as 3 to in excess of several hundred. (Electrical connections to one or more of the plates of the stacked capacitors shown in FIGS. 6A and 6B may be made using the conductive traces 15. The stacked capacitors of FIGS. 6A and 6B have the advantage of providing a high level of capacitance with a very small footprint. They also provide ease of electrical connection to a first plate of the capacitor via a first conductor 15. The other plate of the capacitor 28 may be coupled via alternative circuit connections to other components, some of which may be mounted later on the circuit, such as an integrated circuit, a diode, transistor, or other component for which an RC filter is desired in which one plate of the capacitor is coupled to an exposed electrode.

Other electronic components and structures can be made using the techniques cited herein. For example, varistors, various types of diodes, switches and other electronic components can be made following the teaching of the present disclosure.

Figure 7:
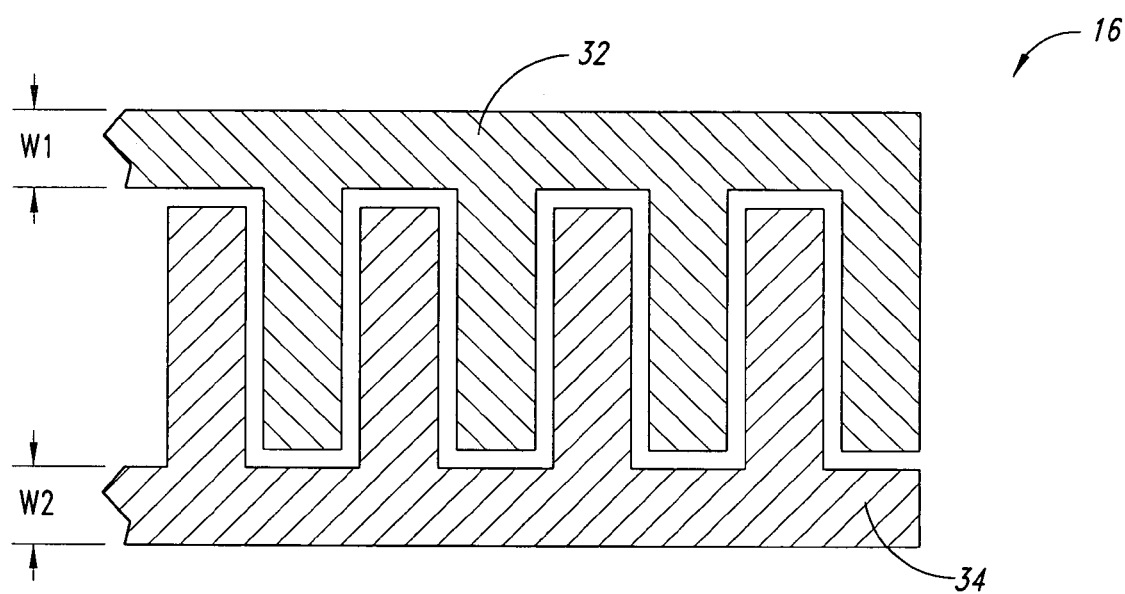
FIG. 7 is an alternative embodiment of a capacitor from the circuit of FIG. 1.

FIG. 7 illustrates an alternative embodiment of a capacitor 16 formed as a comb capacitor. The comb capacitor 16 includes a first plate 32 and a second plate 34. Each of the plates have a desired width W1 and W2, respectively, and a desired spacing and overlap to provide the selective capacitance. The properties of comb capacitors and their design are well-known in the art and any acceptable capacitor design may be used.

A comb capacitor of the type shown in FIG. 7 will be made from the conductive material 19 having the appropriate seed layer therebelow. In most embodiments, the same conductive material 19 used for the conductive trace 15 will also be used for the comb capacitors 16. This provides ease of manufacture. The pattern of the seed layer 17 to be printed is provided in the form of a comb capacitor so that the conductor 19 adheres to the layer of the seed material in the desired pattern and is formed at the same time as the conductive trace 15. Alternatively, a different seed layer may be used for the comb capacitor than is used for the conductive trace 15, thus permitting the capacitor to be formed in a different sequence.

One advantage of using the same seed layer for the conductive layer and the comb capacitor is the ease of manufacture during the printing and formation steps. The comb capacitor can be made in the same steps and simultaneously with the forming of the conductive traces. Similarly, a flat coil inductor may also be formed simultaneously using the same seed layer and conductive layer as explained herein. According to this embodiment, a fewer number of seed layers can be used for the manufacture of the completed circuit. The same seed layer can be used for all conductors and capacitors in the circuit and a different seed layer for all resistors, thus permitting the formation of a completed circuit with resistors and capacitors using only two seed layers of two different materials.

Figure 8A:
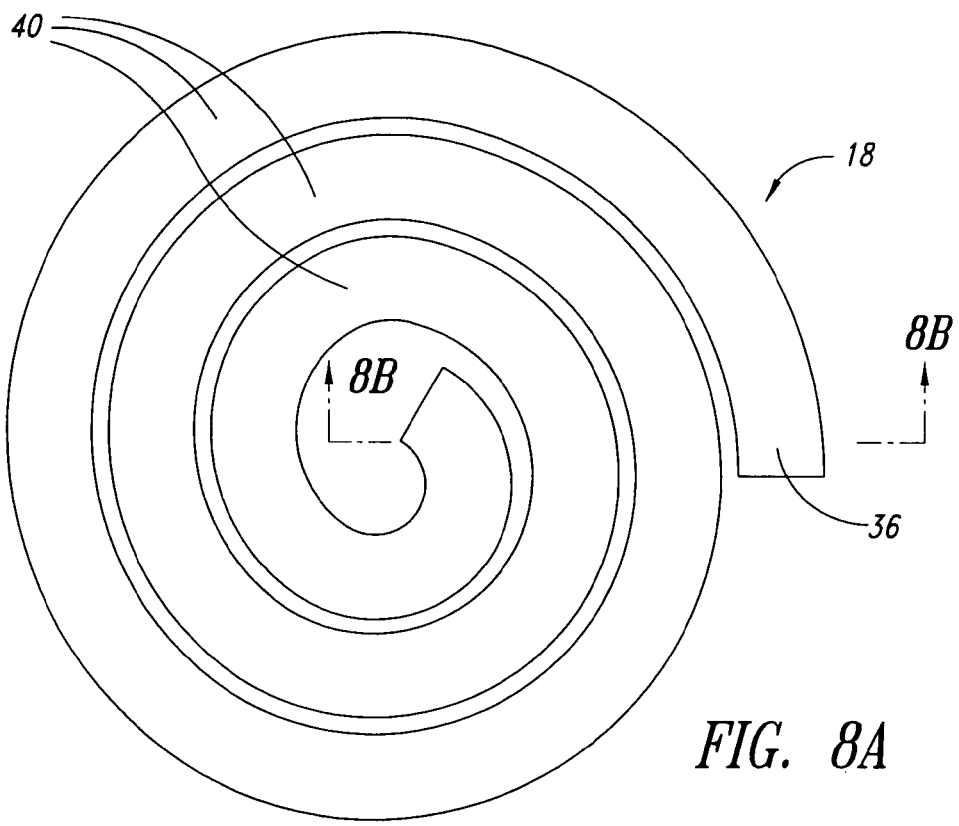
FIG. 8A is a top view of an inductor from the circuit of FIG. 1.
Figure 8B:
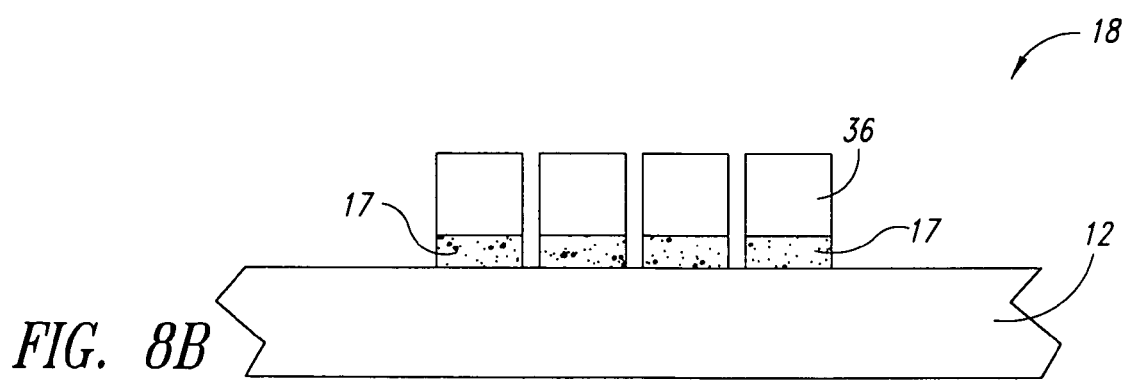
FIG. 8B is a cross-sectional view taken along lines 8B-8B from FIG. 8A.

FIGS. 8A and 8B illustrate an inductor 18 made according to the present invention. The inductor 18 is in the form of a spiral conductor 36 formed on the substrate 12. The conductor 36 includes a plurality of turns positioned closely adjacent to each other in order to provide a desired inductance value. The properties for a given coil configuration, whether a rectangular or cylindrical spiral, are well known in the art and a desired pattern to achieve the selected inductance is used for the seed layer 17 so that the conductor 36 adheres thereto in the selected pattern.

Figure 8C:
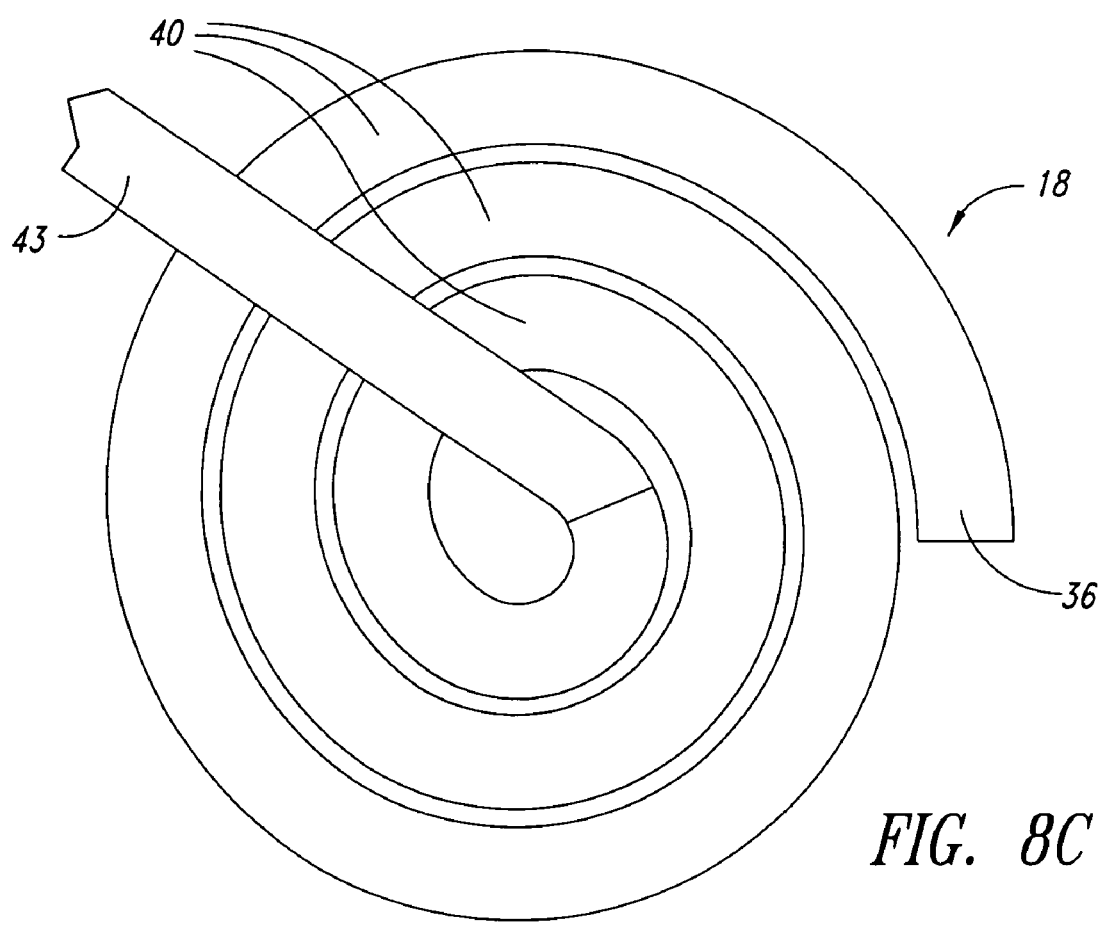
FIG. 8C is a conductive trace coupled to one terminal of the inductor.

FIG. 8C shows a completed inductor 18 having electrical connections at both ends thereof. The conductor 36 is connected in an outer end thereof to an electrically conductive trace of the type shown. The central region of the inductor is coupled to a conductor 43. An electrically insulating layer is positioned between each of the windings 40 and the conductor 43. Such an electrically insulating layer can be formed by a number of acceptable techniques. For example, a blanket deposition of an electrical insulator can be performed over the substrate. Alternatively, an electrically insulating material, such as a biomolecule that is electrically insulating, may be coupled to the upper surface of the conductor 36 using techniques as described herein. Such a dielectric layer may include, for example, a peptide with a $SiO_2$ molecule attached thereto. Other electrically insulating layers may also be used. After the electrically insulating layer is formed on top of the respective coils 40, a conductive trace 43 is formed which electrically connects to the central region of the inductor. The central region may be masked so as to not have an insulator thereon or, if the insulator is initially formed thereon, it may be etched away so as to provide exposure to the conductive layer 36. The conductor trace 43 is formed thereon extending out of the central region of the inductor as shown in FIG. 8C so as to provide electrical connections to the interior end of the inductor.

Figure 8D:
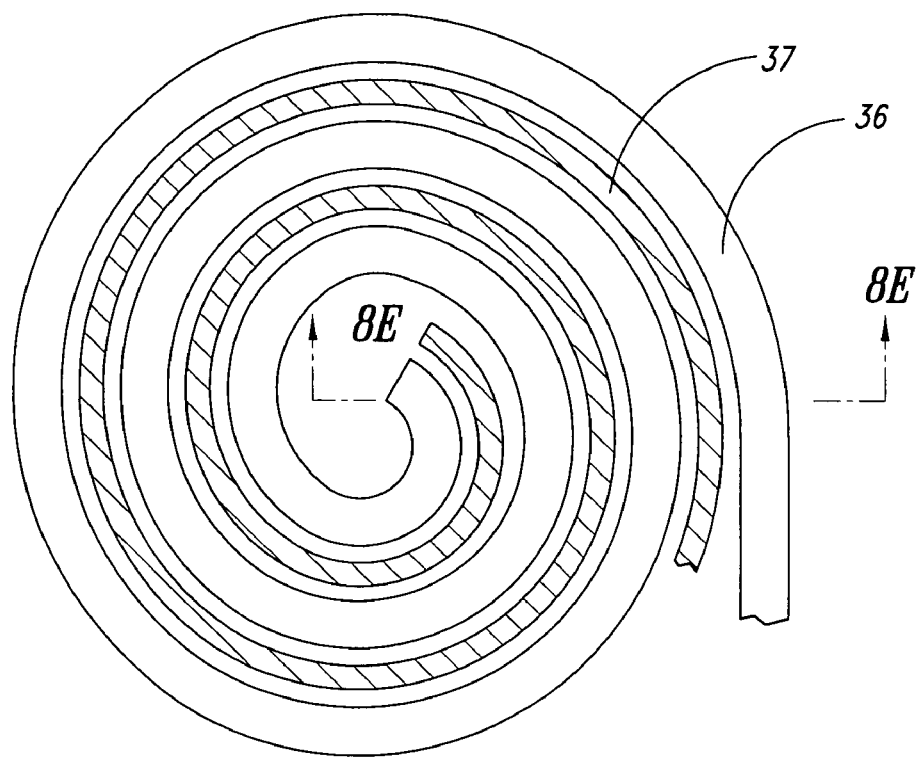
FIG. 8D is a top view of an inductor having a magnetic core made according to principles of the present invention.
Figure 8E:
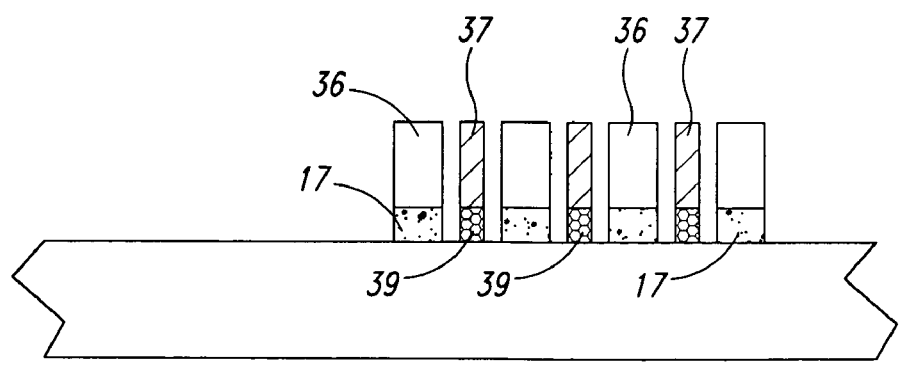
FIG. 8E is a cross-sectional view taken along lines 8E-8E from FIG. 8C.

FIGS. 8D and 8E illustrate a further alternative embodiment of an inductor. In this embodiment, a magnetic material 37 is formed in a spiral pattern adjacent to the conductor 36. The magnetic material 37 is formed by first printing a seed layer 39 having an affinity to the desired magnetic material. The magnetic material may be any of the acceptable known magnetic materials which have an affinity to biomolecule layers. This may include any one of a number of rare earth metals, nickel or alloys thereof, iron, or other ferromagnetic material. Electrical connections could be made to both ends of the inductor shown in FIG. 8D using the techniques disclosed herein. According to this technique, additional windings may be provided so as to form transformers or other electronic components.

Seed Layer

A seed layer comprised of the materials from which a first portion of the electrical circuit will be formed is printed on the substrate 12. The seed layer 17 may comprise a biological material, referred to herein as a biomolecule. The biomolecule may include any of many acceptable biological materials such as a peptide, amino acids, phage, protein, bacteria or a plurality of different biological components. The biomolecule may also be a combination of a biological formation and an inorganic material.

The seed layer can take three different forms, which will now be explained. In a first configuration, the seed layer is a biomolecule which itself is capable of being printed directly on a substrate and also has an affinity for the material to be used to form the electrical circuit. In this configuration, the seed layer itself is of the type that will adhere to the substrate, either by some natural adhesion or some biological affinity. Many proteins, peptides, and other biomolecules are naturally quite sticky and have good adhesion properties, therefore a biological affinity to the substrate is usually not an additional required property.

For those seed layers where a bi-functional biomolecule is used, the biomolecule forming the seed layer will have an affinity of the substrate material to which it is attached. This may be, for example, the substrate itself, an exposed surface of an electrical component as explained herein, or some other material so as to provide selective attachment of a further seed layer to a previously existing layer on top of the substrate. Such bi-functional biomolecules also provide selective deposition at another site thereon for an additional material to be selectively connected thereto as part of the electrical circuit. This additional material may be a dielectric, a conductive layer, or some other additional material which is to be attached to the substrate or another layer present on the electrical circuit.

Another configuration of the seed layer is a combination of a biomolecule and an inorganic material, such as a nanoparticle. The nanoparticle is selected to be of the type that the desired electrical component will have an affinity to the nanoparticle, thus linking the electrical material to the biological molecule. The seed layer is thus composed of the combination of the biomolecule and the nanoparticle.

The seed layer, which is a combination of the biomolecule and the nanoparticle, can be formed by two different techniques. According to a first technique, the biomolecule is in a fluid, such as a solution or gas. The nanoparticle is introduced to this fluid so that the fluid contains both the biomolecule and the nanoparticle. The biomolecule and the nanoparticle bond to each other while in the fluid state. The fluid is then printed as a complete seed layer onto the substrate. According to a different configuration, the combined biomolecule and nanoparticle seed layer is formed by first printing the biomolecule onto the substrate in the desired pattern. After the pattern is printed of the biomolecule, the fluid containing a further component of the seed layer is positioned adjacent to the biomolecule so that it couples to the biomolecule to form the complete seed layer. In this embodiment, the seed layer is made in two steps, a first printing of a biomolecule and then the attachment of the nanoparticle so as to form the completed seed layer. An example, such a seed layer may include a biomolecule with a gold particle coupled thereto, the gold particle having an affinity to copper or gold which naturally couples to a seed layer made of the combined biomolecule and gold nanoparticle.

The biomaterial is preferably formulated in a fluid having a desired viscosity so as to permit printing using standard printing techniques.

Substrates

A variety of materials can be used for the substrate, presenting a surface for disposition of the seed layer, including electrically conductive, semiconductive, or insulative materials. The substrates may include metals, such as thin stainless steel sheets. They may also include prefabricated epoxy resin circuit boards. The substrate may be a semiconductor of any selected desired choice, such as silicon, gallium arsenide, germanium, or other material. Other acceptable substrates include plastics, polyimide layers, a flexible polymer sheet, an insulator, ceramic, laminate substrates, or multilayer substrates composed of any of the other variety of other materials. One advantage of the present invention is the ability to form an electrical circuit on a wide variety of acceptable substrates. One shortcoming of the prior art is the difficulty of forming electrical circuits on certain types of substrates. While epoxy resins are well developed for use as substrates, there is considerably more difficulty in the art using certain types of plastics, glasses, ceramics, or insulators as substrates. The substrate may be a flexible organic layer. For example, it may be a fiber, fabric, cloth, or plant, including a living plant, such as the leaf of a tree. Current technology does not permit the formation of electrical circuits on living plants based on the need to expose to harsh chemicals and high temperature steps. The present invention permits the formation of electrical circuits at room temperature, thus permitting the formation the electrical circuit on a much wider range of substrates than is possible in the prior art. Any substrate on which a pattern may be printed is usable as a substrate in the present invention, thus including practically all possible materials.

The substrates can include multilayer substrates. The substrate can be, for example, glass, quartz, oxide or nitride material, plastic, ceramic, semiconductor such as silicon, germanium, and the like, conductor such as aluminum, composites of materials including metals and semiconductors, and multilayer coating of any of these materials.

The substrates are typically those where a metal film would be grown, including for example Ta, TaN, Ti, TiN, TiW, Mo, Cr, silicon oxide (including silicon dioxide), silicon nitride, silicon oxynitride. These substrates can be, for example, barrier materials which prevent copper diffusion. The substrates may be cleaned, prepared, or coated with a oxide or other substance. In a preferred embodiment, the system is used where the peptide is directly bound without any coating on the substrate in order to direct the metal film directly on the desired layer.

Substrates also can be selected for usefulness in displays including liquid crystal displays. Deposition of seed layers on glass substrates is described in U.S. Pat. No. 6,887,776, which is hereby incorporated by reference in their entirety. Glasses include undoped silica glass (USG), phosphorous doped glass (PSG), boron-phosphorous doped glass (BPSG), soda-lime glass, borosilicate glass, sodium borosilicate glass, alkali-metal borosilicate, aluminosilicate glass, aluminoborosilicate glass, alkaline earth aluminoborosilicate glass, alkaline earth-metal aluminoborosilicate glass, and combinations thereof.

Printing

The present invention permits the printing to be carried out by any currently known printing technique. The printing technique which may be used includes inkjet printing. Inkjet printing is well developed in the art, and numerous solutions having different viscosities have been adapted to inkjet printing. Inkjet printing is also very versatile in providing a wide range of patterns to be printed having various widths and dimensions easily controllable by software. Use of inkjet printing provides a substantial advantage over current techniques for printing circuit boards. With the use of an inkjet printer, the printer can be driven by appropriate software electronics to form the desired pattern. Thus, a mask layer followed lithography processing is not necessary with the present invention. The substrate 12 on which the pattern is to be formed can be simply printed using inkjet printing—in a desired pattern at substantially lower costs than is currently permitted using the expensive masks, exposed etch and treat techniques common in the art today. Other types of printing may also be used. For example, gravure printing, which has advantages for certain substrates and for forming selected patterns. Laser printing, thermal transfer, laser induced thermal transfer, flexo printing, and offset printing may also be used. The present invention is also useful for all methods of lithography.

Inkjet printing also permits different seed layers to be printed at the same time using standard inkjet printing techniques. This will assure self-alignment of the various seed layers. This is accomplished as follows. It is known to print three or four colors in a single printing with an inkjet printer, such as red, blue, yellow, and sometimes also black. This is carried out today with a single ink cartridge having the three or four inkwells therein.

According to the invention, different seed layers are placed into the different ink cartridge wells, just as would be carried out for different colors. One seed layer may be material 17 having an affinity for a conductor, while another seed layer may be material 21 having an affinity for a resistive material, while the third seed layer may be material 25 having an affinity for semiconductor material. These can all be printed from the same ink cartridge, in a single printing as is done today for color printing, thus the relative location of each of the seed layers relative to each other is exactly known and precisely controlled.

In this embodiment, it is not necessary to perform sequential printings on the same substrate after each respective electric material is formed, which step requires some alignment of the substrate for each sequential printing to be correctly positioned relative to the previously printed layer.

This also permits a single printing to be carried out to provide all seed layers needed to form a complete electrical circuit.

One embodiment of the invention provides a method comprising the combination of steps: (i) providing a substrate, (ii) providing a composition, wherein the composition comprises a biological agent such as, for example, a peptide and/or nanoparticles, and (iii) contacting the substrate with the composition so that a seed layer is formed on the substrate. The method can further comprise the deposition step of an additional enhancement metallic layer over the seed layer. The method can further comprise the step of removing the biological agent (e.g., peptide) from the seed layer, either before or after the enhancement step The preferred biological agent is peptide, and a wide variety of peptide structures comprising linked amino acids can be used. The composition comprising the peptide also comprises a liquid dispersion medium for the peptide and the seed layer nanoparticle. The components for the liquid dispersion medium are not particularly limited and mixtures of components can be used. Water-based or organic-based solutions can be used. Examples include water, fluorocarbons, n-alkanes, alcohols, acetonitrile, methanol, ethanol, propanol, isopropanol, hexanes, dodecane, toluene, cyclohexanone, diethyl ether, tetrahydrofuran, dichloromethane, and acetone. Mixtures can be used including mixing in small amounts of organic solvent in water. The liquids should be able to volatilize as needed for the particular application. Factors to consider in solvent selection further include hydrophilicity of the substrate surface, solubility of the nanoparticles, vapor pressure, toxicity, purity, and the like. Surfactants, binders, dispersion agents, and other coating additives can be used as needed. Buffers can be used to control the pH as needed. Stable colloid solutions can be formed and purified further as needed. For example, purification by gel filtration or ultrafiltration can be carried out. Other purification methods include filtration using a Nanosep 10K centrifugal filter.

Biological Agent

A wide variety of peptides of various molecular weights can be used as the biological agent. The peptides can be natural peptides, engineered peptides, unnatural peptides, synthetic peptides, or peptide analogs. Peptides may also be found in nature, or modified from those found in nature, and the study of nature can be used to determine useful peptide sequences. Phage display and other combinatorial or library methods can be used to determine suitable peptides. The peptides can be oligopeptides or polypeptides. A wide variety of amino acids can be used including those found in nature. The peptide can comprise a first peptide binding domain for binding to the nanoparticle. The peptide can further comprise a second binding domain for binding to the substrate. The second binding domain can be a peptide or can be one of two specific binding pair binding domains designed to bind with the surface, the surface comprising the other member of the specifically binding pair.

The peptides can be also used in the synthesis of nanoparticles, where they can act as capping ligands to control nanoparticle shape, size, and crystal morphology. Peptides can also passivate the nanoparticle, improving long term stability.

Peptides can be localized onto the substrate surface via affinity, streptavidin/biotin interaction, or through direct adsorption/placement.

Additionally, commercially available nanoparticles can be used as seed layer. These commercial nanoparticles come with ligands encapsulating them. At times, these nanoparticles can be used with the ligands as supplied, for example, with linkages such as streptavidin or biotin, or with counter ions. Primarily, commercial nanoparticles can be used where the nanocrystals are stabilized by counter ions, such as acetate. Because these counter ion stabilized nanoparticles are typically not stable when salt is added to a solution containing them, ligand exchange can be performed, where a peptide of interest is exchanged with the original counter ion to functionalize the nanoparticles with molecules that make them stable in salt solutions/change their solubility, and/or can act as a hook to cause directed placement for immobilization on the surface.

One skilled in the art, if needed, can refer to the following patent literature for selection of binding peptides using virus, genetic engineering methods, and for materials to be used with genetically engineered viruses. Either phage display or yeast display systems can be used for screening peptides. The materials for specific seed layers and techniques to select or refine such materials are well published in the literature and thus need not be repeated here in text, rather, the following references are cited to provide some of these publications. Phage display libraries and experimental methods for using them in biopanning are further described, for example, in the following U.S. patent publications to Belcher et al.: (1) "Biological Control of Nanoparticle Nucleation, Shape, and Crystal Phase"; 2003/0068900 published Apr. 10, 2003; (2) "Nanoscale Ordering of Hybrid Materials Using Genetically Engineered Mesoscale Virus"; 2003/0073104 published Apr. 17, 2003; (3) "Biological Control of Nanoparticles"; 2003/0113714 published Jun. 19, 2003; and (4) "Molecular Recognition of Materials"; 2003/0148380 published Aug. 7, 2003. Additional patent applications useful for one skilled in the art describe viral and peptide recognition studies with use of genetically engineered viruses for materials synthesis and applications including, for example, (1) U.S. Ser. No. 10/654,623 filed Sep. 4, 2003 to Belcher et al. ("Compositions, Methods, and Use of Bi-Functional BioMaterials"), published 2004/0127640; (2) U.S. Ser. No. 10/665,721 filed Sep. 22, 2003 to Belcher et-al. ("Peptide Mediated Synthesis of Metallic and Magnetic Materials"), published 200510064508; and (3) U.S. Ser. No. 10/668,600 filed Sep. 24, 2003 to Belcher et al. ("Fabricated BioFilm Storage Device"), published 2004/0171139, (4) U.S. application Ser. No. 10/965,665, filed Oct. 15, 2004 to Belcher et al. ("Viral Fibers"), and (5) U.S. Ser. No. 101,965,227 filed Oct. 15, 2004 to Belcher et al. ("Multifunctional Biomaterials . . . "); and (6) U.S. application Ser. No. 101,976,179, filed Oct. 29, 2004 to Belcher et al. ("Inorganic Nanowires"). These references describe a variety of specific binding modifications which can be carried out for binding to conjugate structures, as well as forming the conjugate structures in the presence of the material modified for specific binding. Semiconductor applications of bifunctional peptides are described in, for example, U.S. provisional application 60/571,532 filed May 17, 2004. Yeast display peptide systems are described in, for example, U.S. regular application Ser. No. 11/051,481 filed Feb. 7, 2005. Each of the above references are hereby incorporated by reference in their entirety.

Reiss et al., "Biological Routes to Metal Alloy Ferromagnetic Nanostructures," Nanoletters, 2004, Vol. 4, No. 6, 1127-1132 describes peptides for binding to metals, including mediating nanoparticle synthesis. Flynn, Mao, et al., "Synthesis and Organization of Nanoscale II-VI semiconductor materials using evolved peptide specificity and viral capsid assembly," J Mater. Sca., 2003, 13, 2414-242 1, describes peptides for binding to and nucleation of semiconductor nanoparticles. Mao, Flynn et al., "Viral Assembly of Oriented Quantum Dot Nanowires," PNAS, Jun. 10, 2003, vol. 100, no. 12, 6946-6951 further describes peptides for binding to and nucleation of semiconductor nanoparticles. Each of the above references are hereby incorporated by reference in their entirety.

Specific biological complexes or binding pairs known in the art such as, for example, biotin and streptavidin can be used to promote bonding between the peptide and the surface. Other examples include glutathione-S-transferase/glutathione; 6× Histidine Tag/Ni-NTA; S-protein/S-peptide; or biotin/avidin. Peptides can be, for example, biotinylated and can be synthesized through commercial peptide synthesis vendors. One example of an acceptable peptide is peptide 3222, with a sequence of CALNN, a known covalent Au binder found in the literature (Levy et al., J. Amer. Chem. Soc., 126, No. 32, pp. 10076-10084, 2004, which is herein incorporated by reference in its entirety.), was made synthetically (Peptide 3222A) as well as synthesized with a biotin added on the N terminus (Peptide 3222B). This peptide can be designed to stabilize Au nanoparticles by forming a dense, self assembled monolayer. Stabilized nanoparticles produced using this peptide can be purified and handled like stable proteins (e.g., by size exclusion chromatography, ultrafiltration, electrophoresis, lyophilization, and the like).

Au nanoparticles can be coupled to this peptide either by reduction of a precursor or by ligand exchange to provide the seed layer. A biotinylated version of that peptide was prepared and found to also give stable Au colloids.

The peptide itself or the peptide's other binding site such as, for example, the peptide's biotin functionality can be exploited for specific localization onto a surface or a substrate. Alternatively, the peptide can be directly adsorbed to a surface or substrate or can be interacted with the substrate in a patterned way, so that the subsequent films grown follow the shape of the peptide pattern. Also, bifunctional peptides can be used, where one end of the peptide or virus is engineered to bind to a seed material, while the other end of the peptide has engineered specificity to bind to a substrate or surface.

Generally, non-covalent binding is desired between the peptide and the nanoparticle, and between the peptide and the substrate surface.

Other peptides used include phage display discovered peptides screened against Au (Peptide 1: VSGSSPDS; Peptide 2: LKAHLPPSRLP) as well as peptides obtained from the literature that are known to interact with Au (Peptide 3: MHGKTQATSGTIQS, see for example Brown, S., "Metal Recognition by Repeating Polypeptides," Nature Biotechnol, 15, 269-272 (1997), which is hereby incorporated-by reference in its entirety). Peptides used in this application have been synthesized with biotin on their N-termini and have been HPLC purified to >90% purity. These Au peptides can also be used to grow other nanocrystals, including Pd nanocrystals, in addition to Au nanocrystals. Some peptides can have a high affinity for multiple materials. For example, peptide 2, in addition to being able to bind to or grow gold, also has a high affinity for glass.

Removal of Bio-Materials

In one embodiment, the biological materials, and in particular peptide, once placement of a seed layer is successfully completed, can be generally volatilized and removed so that, they cannot be detected in the final film or electrical circuit if desired. However, some residue may remain in a final product reflecting the source of the intermediate product comprising peptide. This substantial removal can be described in terms of weight percentage remaining. For example, the amount of remaining biological materials with respect to the total amount of film including biologicals can be so low as to be negligible.

One embodiment of the invention is the substantial removal of the biologicals in the production of high quality metal films. Embodiments include both products which comprise peptide and final products which comprise only peptide residue or substantially no peptide or peptide residue. Residues can be analyzed by, for example, carbon content including surface analysis such as XPS. In other patent applications, which are hereby incorporated by reference in their entirety, U.S. Ser. No. 101,665,721 filed Sep. 22, 2003 to Belcher et al. ("Peptide Mediated Synthesis of Metallic and Magnetic Materials"), published 2005/0064508; and U.S. application Ser. No. 10/976,179, filed Oct. 29, 2004 to Belcher et al. ("Inorganic Nanowires"), (see also Mao et al., Science, vol. 303, Jan. 9, 2004, pages 213-217) additional description is provided for burning off and elimination of a biologicals from materials to which the biologicals can selectively bind.

Heating to remove the peptide can also result in effects on the nanoparticle seed layer or the enhancement layer. For example, nanoparticles can coalesce with heating and form a more continuous film. Heating can also enhance the metal film's adherence to the substrate. In other embodiments, the seed layer is not removed but remains in place on the substrate, coupled to the electrical circuit.

Nanoparticle Seed Layer Material

The deposition process of the seed layer material has to be optimized for different applications and functions. For example, one goal is to provide a catalytic effect when later a metal such as copper is further disposed on the seed layer. Another goal can be to influence the texture of a metal such as copper which is further disposed on the seed layer. For example, copper <111> texture can be enhanced to provide better electromigration performance. The seed layer step coverage, conformality, and texture can be adapted for particular applications.

The seed layer material is selected to be compatible with the enhancement step to form a continuous film. In the case of Cu enhancement, both Au, Pd, Ru and Ni seed layers have been shown in the literature to form Cu films after electroless Cu plating. Many metals can be used as a seed layer that catalyze copper plating, examples include aluminum, silver, cobalt tungsten alloys, manganese, molybdenum, nickel, palladium, platinum, tin, zinc, tantalum, titanium, metal oxides, oxides nitrides, phosphides and any alloys of each of these listed.

The seed layer can comprise material, such as metal, which is the same material as the enhancement layer, or different material from the enhancement layer. For example, gold seed layers can be used for both gold and copper enhancement layers.

The nanoparticles do not generally require the presence of a surface coating to allow binding to the biological agent such as a peptide. Nanoparticles can be inorganic nanoparticles or metallic nanoparticles including alloys. In some embodiments, they can be semiconductor nanoparticles. Nanoparticles can be quantum dots. Examples of semiconductor nanoparticles include cadmium sulfide, cadmium selenide, silver sulfide, cadmium sulfide, zinc sulfide, zinc selenide, lead sulfide, gallium arsenide, silicon, tin oxide, iron oxide, and indium phosphide. Nanoparticles can be crystalline or amorphous.

The nanoparticles can be characterized by particle sizes which can be, for example, about 200 nm or less, about 50 nm or less, about 25 nm or less, or about 10 nm or less. The particle size can be, for example, about 1 nm or more, or about 3 nm or more, or about 5 nm or more. The particle size can be, for example, about 1 nm to about 10 nm. The particle size can be determined by a linear dimension in any direction on the order of nanometers, e.g., 1 nm to 100 nm.

The size of the nanoparticle can affect the melting temperature of these particles, and the skilled artisan can adjust this parameter to achieve a desired melting performance for a specific application.

If desired, the nanoparticles can be polydisperse or substantially monodisperse in size. For example, the particle size can have a standard deviation of 5% or less.

The nanoparticles can be amorphous, crystalline, and if crystalline can show different crystalline phases. Nanoparticles are not limited by a particular aspect ratio but generally will not be nanowires and generally can have aspect ratios of about 10:1 or less. Dimensions can be sufficiently small to provide for quantum confinement effects. Core-shell structures can be used.

Solution phase reduction from a metal salt can be used to prepare the nanoparticles. Alternatively, nanoparticles can be prefabricated by other methods, without use of the biological agent such as peptide, and then bound to the biological agent such as peptide.

Growth of nanoparticles in the presence of biological agents and peptides is described in the aforementioned Belcher patent publications and technical literature including, for example:

The following patents are incorporated by reference in their entirety: U.S. Pat. No. 6,207,392 to Weiss et al. describes semiconductor nanocrystals and linking agents; U.S. Pat. No. 6,235,540 describes semiconductor nanoparticles linked to ligands; U.S. Pat. No. 6,417,340 describes nanoparticles.

An example of copper nanocrystal growth on peptides can be found in Banerjee et al, PNAS, Dec. 9, 2003, 14678-14682, vol. 100, no. 25, which is hereby incorporated by reference in its entirety. Copper nanocrystals and seed layers are further described in U.S. Pat. No. 6,887,297 and US Patent Publication 2004/0091625 (Winter) as well as U.S. Pat. Nos. 6,780,765; 6,774,036; and 6,277,740 (Goldstein), which are hereby incorporated by reference in their entirety.

The seed layer can be characterized by a film thickness. Film thickness can be for example 500 nm or less, or 250 nm or less, or 100 nm or less, with a preferably range being 50 nm to 500 nm, or 50 nm to 250 nm, or 100 nm to 250 nm.

U.S. Pat. No. 6,879,051 describes one method to determine seed layer thickness of trench side walls.

Technical literature related to seed layers include: Biberger et al., http://www.novellus.com/damascus/tec/tee_0.5.asp; "Low Pressure Sputtering of Copper, and Related Barriers, for Seed Layers and Complete Planarization;" Healey, "Current Technical Trends: Dual Damascene & Low-k Dielectrics"; Ryu et al, "Electromigration of Submicron Damascene Copper Interconnects" (1988 Symposium on VLSI Technology; Jun. 8-11, 1998); Wong et al., "Barrier/Seed Layer Requirements for Copper Interconnects" 1998 International Interconnect Technology Conference (San Francisco, Calif.), Jun. 3, 1998; Marasimhan et al., "In-Line Process Control of Advanced Thin Films at 65 nm and Beyond", Yield Management Solutions, Vol 6(2), Summer 2004, pages 1-16.

The seed layer can be uniformly applied or a selective patterning can be carried out wherein only certain areas are printed with seed layer and other areas are not printed. Masks on the substrates can be used which prevent deposition of the seed layer on top of the mask and favor deposition on the unmasked regions. Possible deposition or patterning techniques for the seed layer include spin coating, printing (inkjet, offset, contact, and the like), dip coating, electrophoretic deposition, spray coating, slot coating, drum coating, various ways of patterning molecules to capture the nanoparticle seed, and the like.

The seed layer can be characterized by scanning probe methods including AFM.

If desired, the seed layer can be annealed with heat to increase density and improve subsequent enhancement steps. For example, annealing can be carried out for at least 5 minutes, at least 10 minutes, or at least 20 minutes. Annealing temperature can be for example at least 100° C., at least 150° C., or at least 200° C. AFM can be carried out before and after annealing and surface area roughness measured. Surface area roughness before and after annealing can be for example 10 nm or less, or 5 nm or less, or 3 nm or less—Annealing can result in a reduction of surface area roughness of 5% to 30%, or 10% to 20%.

In many cases, conformal coatings of the seed layer are desired, and peptide binding and conditions are selected to achieve conformal coating. In many other cases, a selective deposition is desired wherein seed layer is formed in some areas but not others.

In addition to patterning during deposition of the seed layer on an unpatterned substrate, noted above, the substrate can be patterned before deposition of the seed layer, so that the seed layer does not form on all of the surface of the substrate. Masks on the substrate can be used to prevent deposition.

Whether for patterning the seed layer deposition on unpatterned substrates, or for patterning the substrate before seed layer deposition, methods for patterning, lithography, and direct-write are known in the art as described in for example, (i) Pique (Ed.), Direct-Write Technologies for Rapid Prototyping Applications, 2002, Academic Press, including Chapter 18, and (ii) Madou, Fundamentals of Microfabrication, The Science of Miniaturization, 2nd Ed., CRC Press, 2002, pages 344-357, which are hereby incorporated by reference in their entirety. Screen printing, flexoprinting, gravure printing, and ink jet printing or patterning can be used.

Microcontact printing can be used if desired for patterning. Optical microscopy or scanning probe methods can be used to characterize the pattern. For example, lines can be patterned having line width of 250 µm or less, 100 µm or less, 10 µm or less, one micron or less, 500 nm or less, or 100 nm or less. The distances between patterned features can be, for example, 10 µm or less, one micron or less, or 500 nm or less. High resolution patterning is generally preferred.

Enhancement

To form a continuous metal film, free of voids and good uniformity, enhancement steps can be performed on the seed layers so that a metallic film is formed over the seed layer. These enhancement techniques include, electro-plating and electroless plating. Additional enhancement steps can be, for example, CVD or PVD. The films can be characterized by scanning probe methods, including AFM, and optical microscopy. The particle nature of the enhancement can be measured with use of average grain size and grain size standard deviations.

Metal deposition processes, including electroless metal deposition, electrodeposition, and seed layers, are described in Madou, Fundamentals of Microfabrication, The Science of Miniaturization, 2nd Ed., CRC Press, 2002, pages 344-357, which is hereby incorporated by reference in its entirety. In Particular, copper deposition is described. Electroless deposition is described in, for example, U.S. Pat. Nos. 5,891,513 and 5,830,805, which are hereby incorporated by reference in their entirety.

If desired, the metal of the seed layer can be the same as the metal of the enhancement step or a different metal can be chosen. For example, the seed layer can be copper but is not necessarily copper when copper is used in the enhancement step.

Film thickness of the enhanced film can be, for example, one micron or less, 500 nm or less, 400 nm or less, 300 nm or less, 200 nm or less, or 100 nm or less. Exemplary ranges include 50 nm to 500 nm, or 100 nm to 200 nm.

The process temperature of the enhancement step can be for example 100° C. or less, 80° C. or less, 60° C. or less, or 40° C. or less. Enhancement growth can be carried out with each step of for example one minute to 300 minutes, or two minutes to 100 minutes. Temperature and time can be adjusted as needed for a particular application.

Electroless plating (ELP) including copper ELP bath chemistries and methods are known. For example, formaldehyde-based ELP copper bath can be used. Another example is amine borane reducing agents and ligands based on neutral tetradentate nitrogen donors. See for example R. Jagannathan et al., IBM J. Res. Develop., Vol. 37, No. 2, March 1993, pages 117-123. An example of electroless gold deposition is Kato et al., J. Electrochem. Soc., 149, C 164 (2002), which is hereby incorporated by reference in its entirety. Another example of electroless deposition of thin metallic films is Pinto et al., Polymer Preprints, 2003, 44(2), 138-139. Electroless plating of gold and gold alloys is described in Okinaka, Chapter 15, "Electroless Plating of Gold and Gold Alloys, pages 401-420 (from Electroless Plating—Fundamentals and Applications, Ed. Mallory, Glenn 0.; Hajdu, Jun. B, 1990, William Andrew); each of the above are hereby incorporated by reference in their entirety.

The final film, including final copper films, can be tested for resistivity. Resistivity can be, for example, 100 µΩ-cm or less, 50 µΩ-cm or less, 10 µΩ-cm or less, or 1 µΩ-cm or less. Resistivity can be, for example, about 0.01 µΩ-cm or more. In general, resistivity should be similar to bulk copper which is 1.7 µΩ-cm. Resistivity range can be, for example; about 1.5 to about 4, or about 1.7 to about 2.6 µΩ-cm.

For all of the approaches, the biological peptide may be removed by annealing after the seed layer step, but before the electroless plating, and/or after the electroless plating step, or not at all, depending on application and functional need. Annealing can improve conductivity or adhesion. The temperature of annealing can be, for example, about 400° C. or less, or about 300° C. or less, or about 200° C. or less. The annealing time can be, for example, at least about 15 minutes, or at least about 30 minutes, or at least about 60 minutes.

Applications

Devices and apparatuses known in the art can be used. The compositions and methods described herein can be used in damascene processes. Additional applications in the electronics industry include optically active films, CMOS, transistors, TFT, OLED, field effect transistors, high power semiconductors, DRAM, LEDs including III-V LEDs, flat panel displays, and photovoltaics. Conductive interconnects can be used in and to produce articles such as semiconductor chips, memory devices, semiconductor dies, circuit modules, and electronic systems.

The seed layer technology can be used in active matrix liquid crystal display (AMLCD) applications as described in, for example, U.S. Pat. No. 6,887,776.

Also incorporated by reference is a provisional application titled "Biologically directed seed layers and thin films" by Michael Spaid et al., provisional application 60/680,491, filed on date May 13, 2005.

A method of forming the printed circuit 10 according to principles of the present invention will now be described.

Figure 9:
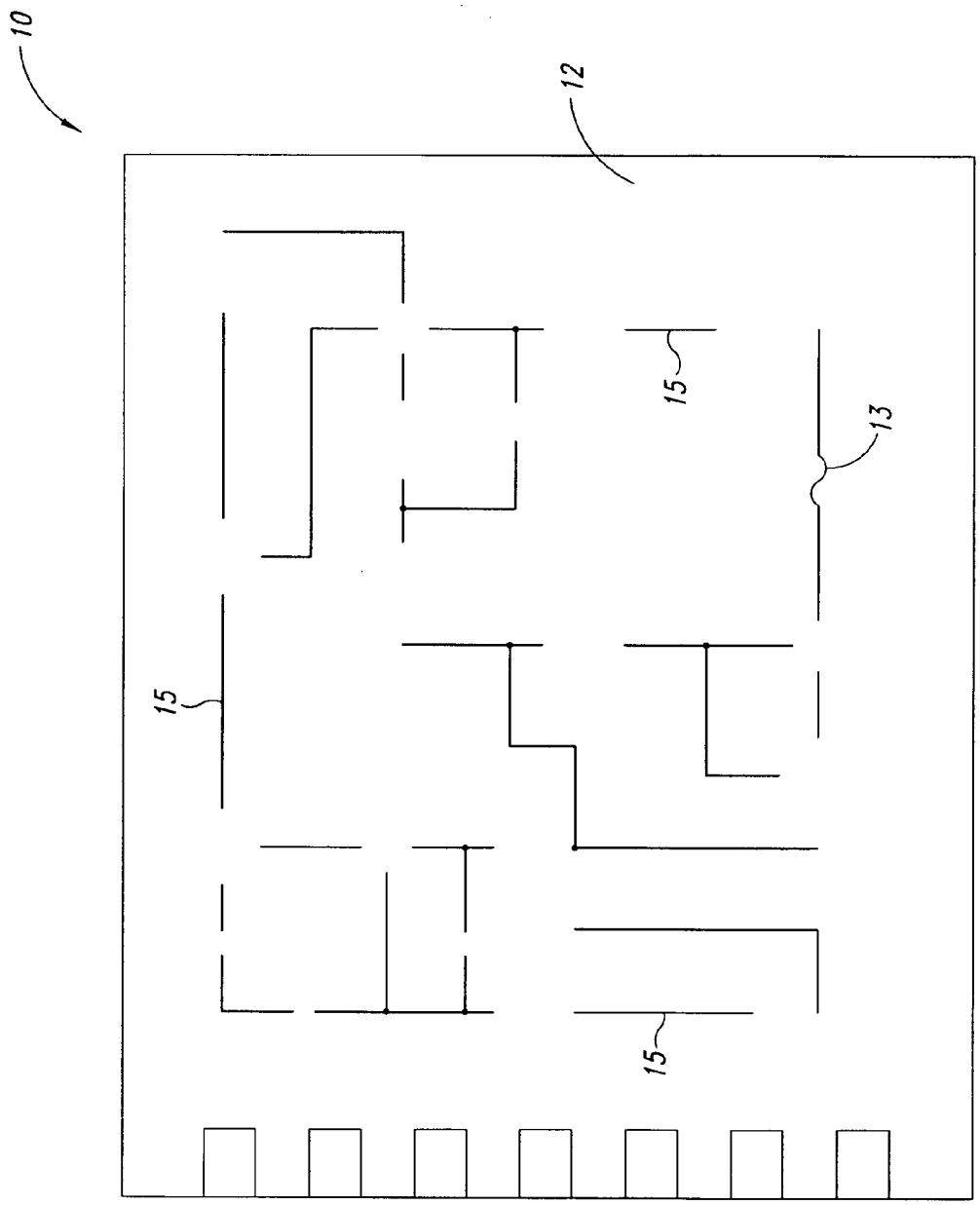
FIGS. 9-12 illustrate various steps in a method of making a printable electronic circuit according to the present invention.

FIG. 9 provides a specific example of circuit construction according to the principles of the present invention. A first material 15 is printed on the substrate 12 having the selected pattern. The seed layer 15 is printed directly onto the desired substrate using the appropriate printing technique. The substrate is then exposed to a solution having the appropriate precursor therein for the desired electronic component. The precursor will form out of the solution leading to the selective deposition of a thin conductive film 13 of the desired composition at the location of the printed seed layer. The electrical circuit is therefore easily formed at a low temperature, such as room temperature, with fewer steps at a substantially lower cost. Further, the cost of changing from one pattern to another is essentially zero since software can easily control many different printing patterns as described herein. It is not necessary to make a new mask as is required in the prior art of printed circuit boards.

If a further electrical component having different properties is desired to be formed in the electrical circuit, then the above steps are repeated. Namely, an appropriate seed layer is formed which has an affinity to the material to be provided for the subsequent passive material.

Figure 10:
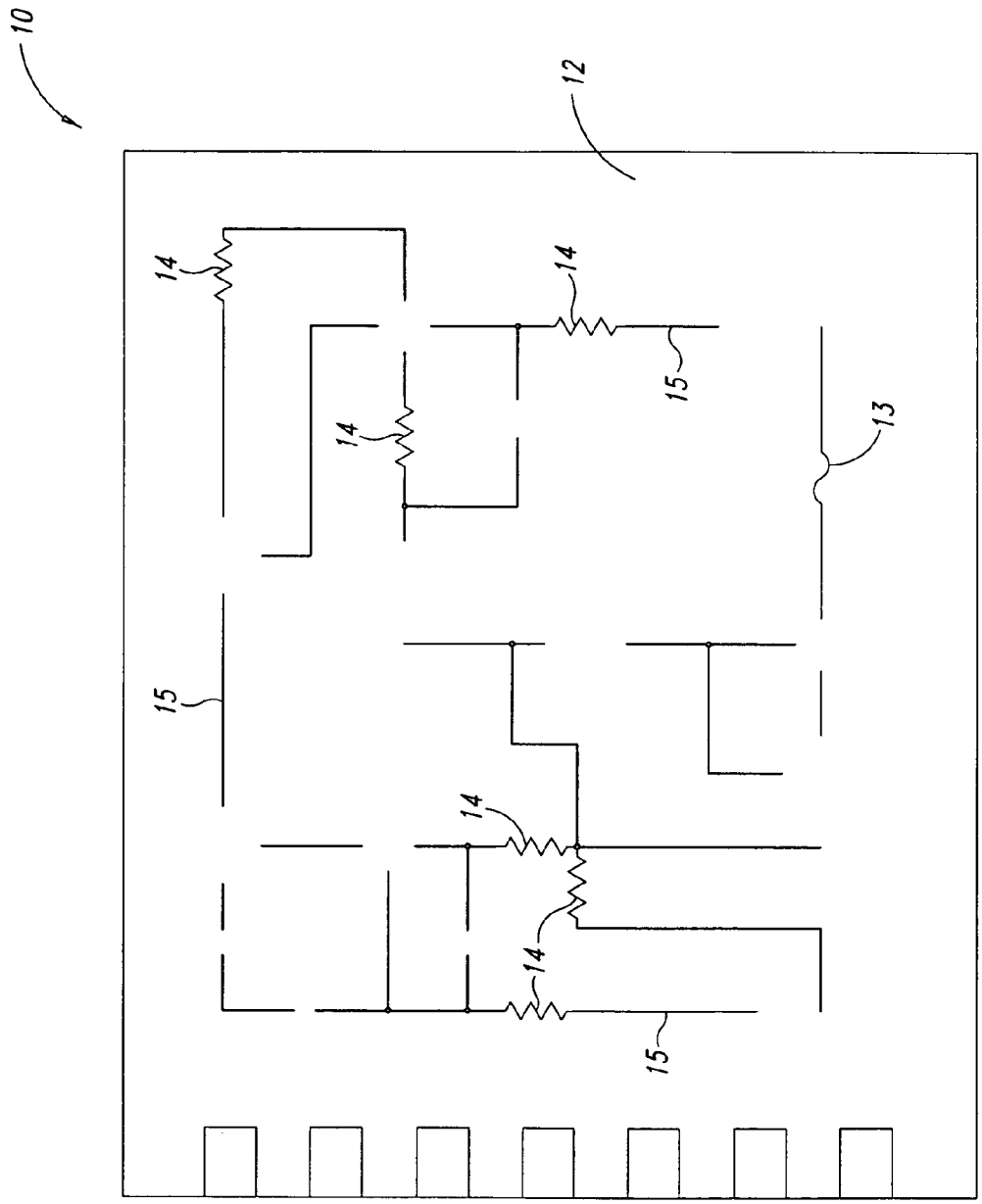

As shown in FIG. 10, a new seed layer 14 for the resistor material 20 will be printed at the selected locations on the substrate 12 where it is desired to form resistors.

Figure 11:
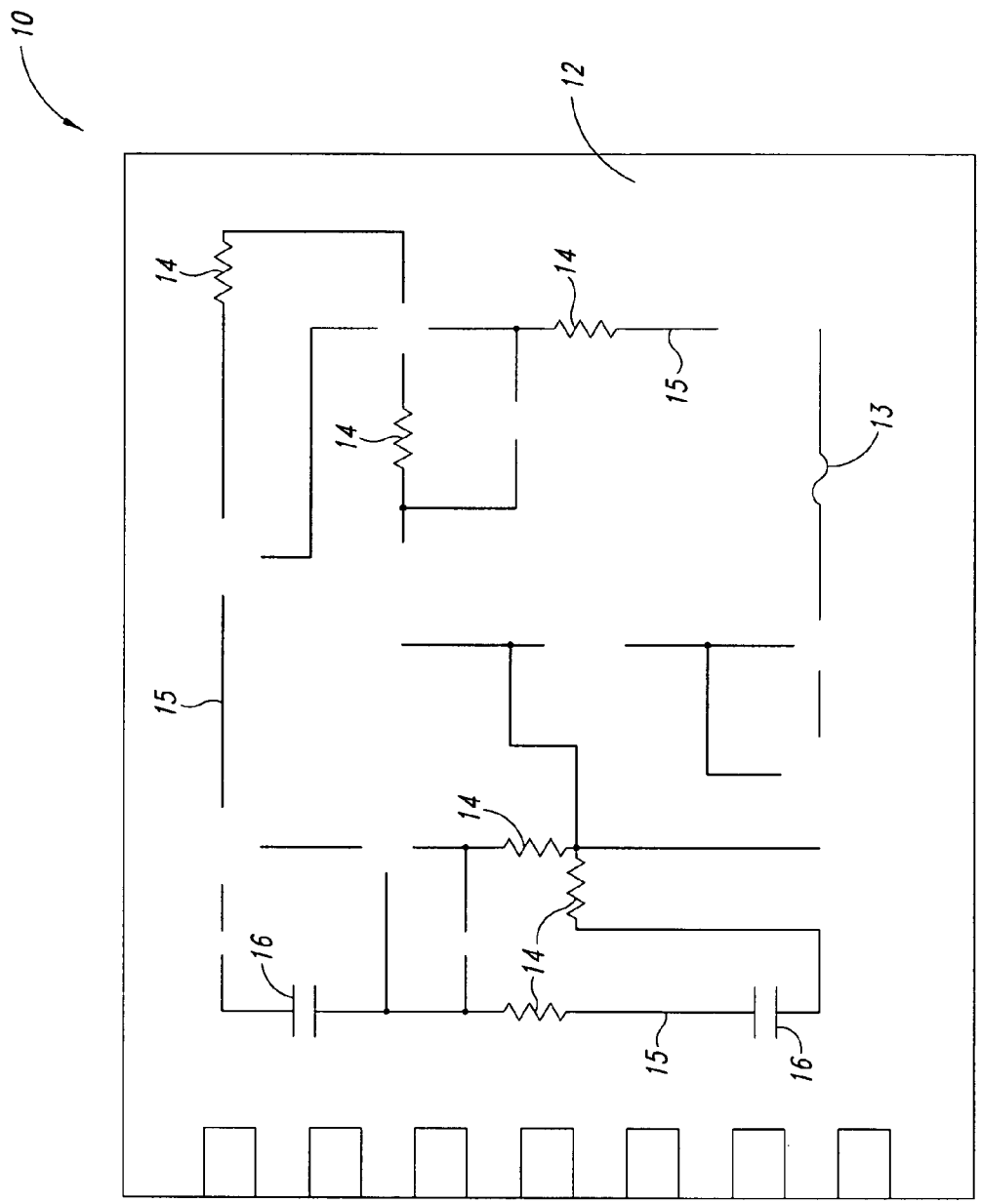

FIG. 11 shows additional seed layers 33 being formed for use with forming a stacked capacitor as shown in FIGS. 6A and 6B. The subsequent steps are then carried out to form the full capacitors.

Figure 12:
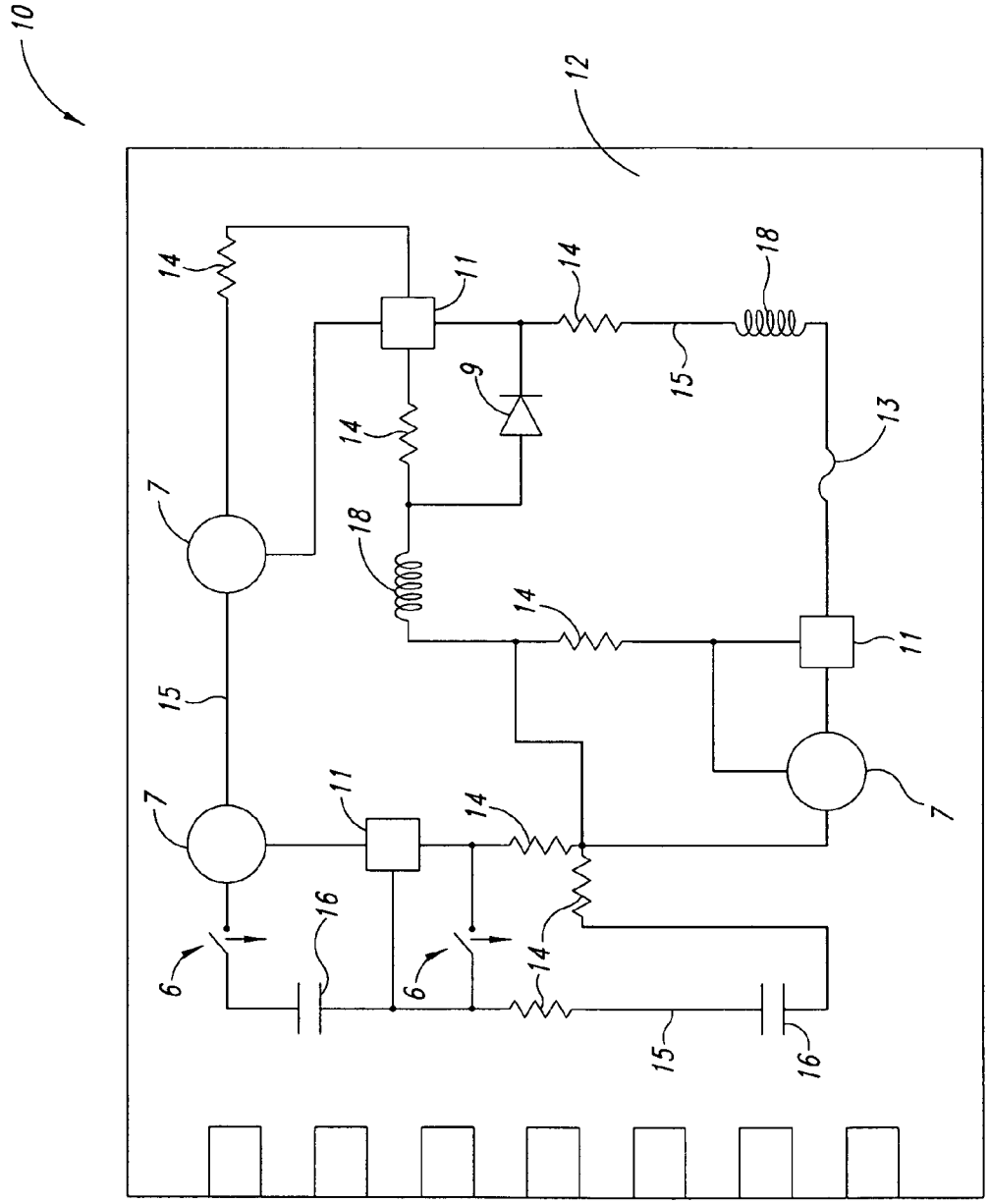

FIG. 12 illustrates the printing of the subsequent seed layers at the appropriate locations in order to form the diodes, switches and inductors, followed by the exposure of the substrate to respective solutions containing the appropriate precursors to the materials to be used for the component.

If the inductors 18 are of the type being formed from the same conductive material, the same printing layer used in the first seed material may be used to form the capacitors, inductors, and other components having a common conductive layer.

Selectively depositing other layers on top of preexisting layers can also be carried to form the stacked capacitors as shown and described with respect to FIGS. 6A and 6B. In addition to forming stacked capacitors, the technique may also be used to form various passivation layers, protective layers, or other materials. For example, a thin protective layer of nickel may be desired to be formed on top of a conductor in order to prevent the oxidation of the conductor. It is well known that aluminum and copper easily oxidize and in some instances such oxidation has to be prevented. Accordingly, a seed layer having an affinity for the underlying conductor layer may be exposed to the surface of the substrate.

One benefit of the present invention is that the second seed layer may be directly formed in a self-aligned manner on top of the previously patterned material without requirement of printing a new seed layer. The second layer seed is selected to be a bi-functional material having sensitizers to the appropriate underlying material onto which it is to be deposited. A seed layer having an affinity to a conductor, but not having an affinity to the substrate will be provided in a solution. The entire substrate is exposed to a fluid having the new seed layer, such as by being dipped in the solution causing a newly deposited seed layer to be formed from the solution onto the previously deposited material. Since the precursor in the solution does not have an affinity for the substrate, it may not attach at all, or it can be easily washed off, but it will adhere strongly to the target layer. This permits the seed layer to be self-aligned directly on top of any previously patterned material without the requirement of printing or a mask.

A simple exposure of the substrate surface to the solution of the seed material followed by a wash step will cause the selective deposition of the bi-functional second layer seed on the desired preexisting patterned layer due to the affinity of the seed with such patterned layer. The second layer is therefore automatically self-aligned to the first layer without the need for additional printing or alignment. Such selective depositing may be continued as many times as desired in order to provide stacked or linear materials on the substrate that are self-aligned.

The different seed layer is selected to also have an affinity to the next electrical component to be printed on the printed circuit board, making it bifunctional. Thereafter, the printed circuit board is placed in a solution having the precursor to the desired electrical component which will form a new layer on the circuit 12. FIGS. 6A and 6B illustrate the formation of the upper layers of the capacitor of the lower layer of the capacitors 14, thus illustrating the use of the selective deposition of additional seed layers to form stacked capacitors according to the present invention.

Thus, shown in FIGS. 9-12 the respective seed layers are selectively printed at the desired locations to form the electrical components which become the electrical circuit.

According to an alternative embodiment of the present invention, the printing of the seed layers are carried out simultaneously for each of the circuits formed in FIGS. 9-12. Namely, each of the seed layers having a different affinity for a different electrical component are provided to the printer. Printers which are capable of simultaneously printing multiple inks at the same time are well known in the art. A fluid containing the seed layers is provided using the same type of system which would be used to print a multi-ink pattern. The seed layers are therefore printed in a single pass, each of exactly aligned with respect to each other. Since they are all printed in a single pass, there is no need reposition and align the substrate for each of the different printing steps of the different seed layers. The printed substrate is then exposed to a fluid containing each of the respective electrical component materials which are to be adhered to the electrical circuit. The different electrical components may be in separate fluids and the substrate exposed to each of the fluids sequentially. Alternatively, one or more of the electrical components may be combined into a single fluid. Since the electrical components have an affinity only to the seed layer they match with, the substrate having the multiple seed layers thereon may be placed into a solution or exposed to a fluid having multiple precursors therein for each of the respective electrical components. The respective electrical material will have an affinity for and thus associate with the respective seed layers while not coupling to the substrate or the other seed layers for which it does not have an affinity. Namely, in this embodiment, the particular material will be selectively deposited only to the specific seed layer for which it has an affinity and will not be deposited to the other layers. Each of the other layers will have selectively deposited on them the material which has an affinity for them and the other material.

Use of Biomolecules as Intermediate Between Ink and Seed

Figure 13B:
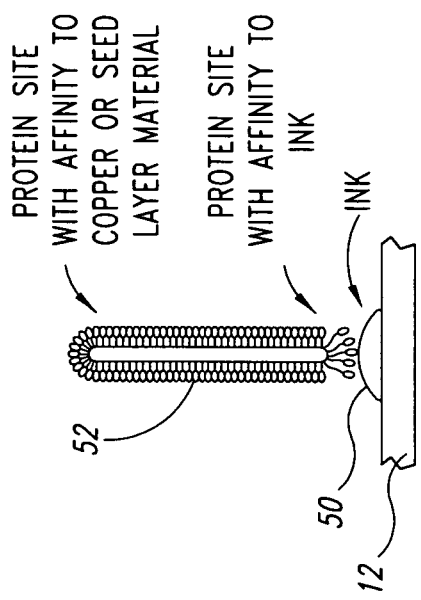
FIG. 13B illustrates a protein having an affinity for a selected ink.
Figure 13A:
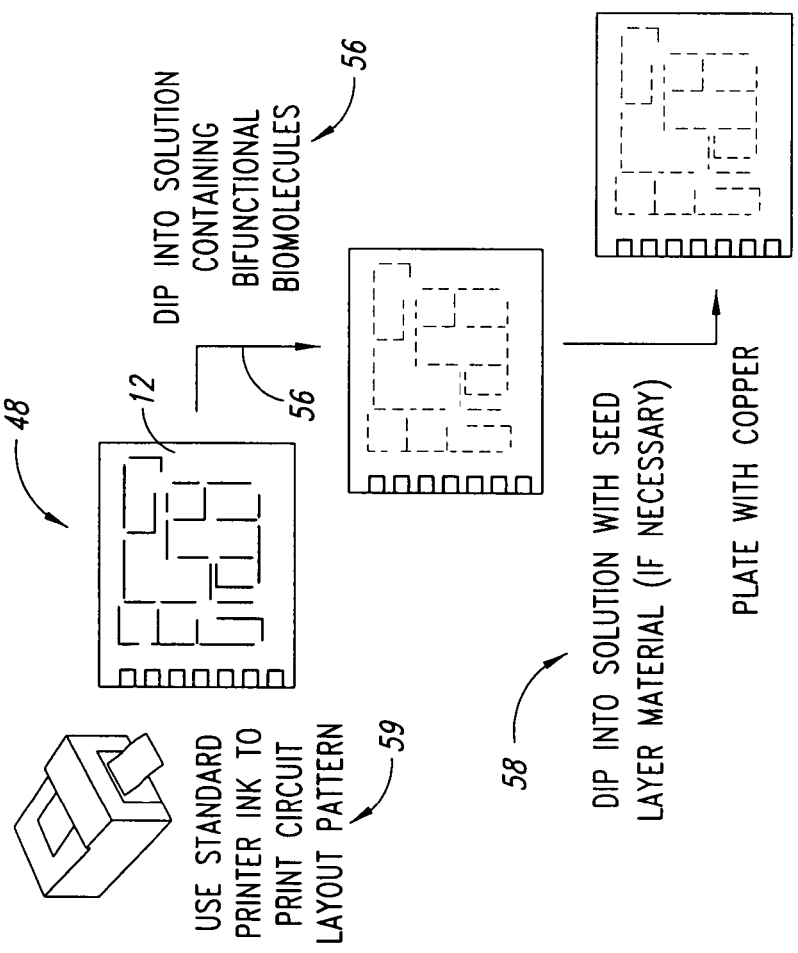
FIG. 13A illustrates an alternative embodiment for printing an electrical circuit according to principles of the present invention.

FIG. 13A illustrates yet another embodiment according to principles of the present invention. If the biological material to form the seed layer cannot be easily printed, then the embodiment of FIG. 13A provides an alternative technique for forming a printed circuit pattern according to principles of the present invention. As shown in FIG. 13B, an ink pattern 48 having a plurality of ink dots 50 is formed on a desired substrate 12. The ink is selected to have desired chemical properties for which a known biomolecule has an affinity with that ink. In the example of FIG. 13B, a protein 52 has the desired properties for acting as a seed material. However, the protein 52 may be of the type which may become denatured if known printing techniques are used for placing it on a substrate. It may also be of the type which is not easily susceptible for placing into a solution with a plurality of precursors.

According to the embodiment of FIG. 13A, the ink is first printed in the desired pattern 48 on the substrate 12. The substrate 12 is then exposed to a solution or other fluid containing the biomolecule 52 which has an affinity to the printed ink dot 50. The biomolecule 52 is also selected to have an affinity at the top, or other region thereof, to the desired electrical component or the seed layer. After the biomolecule 52 adheres to the printed ink 50, such as by being dipped in a solution containing bi-functional biomolecules as shown in step 56, the substrate is dipped into a solution with the appropriate material to be coupled to the bi-functional biomolecules, as explained herein. The solution may contain a precursor to the electrical component to be formed, such as a copper layer. Alternatively, it may include a seed layer which has an affinity for the electrical component to be formed. The dipping in the various solutions continues until the desired electrical component is formed in the pattern that has been printed with ink.

Figure 14:
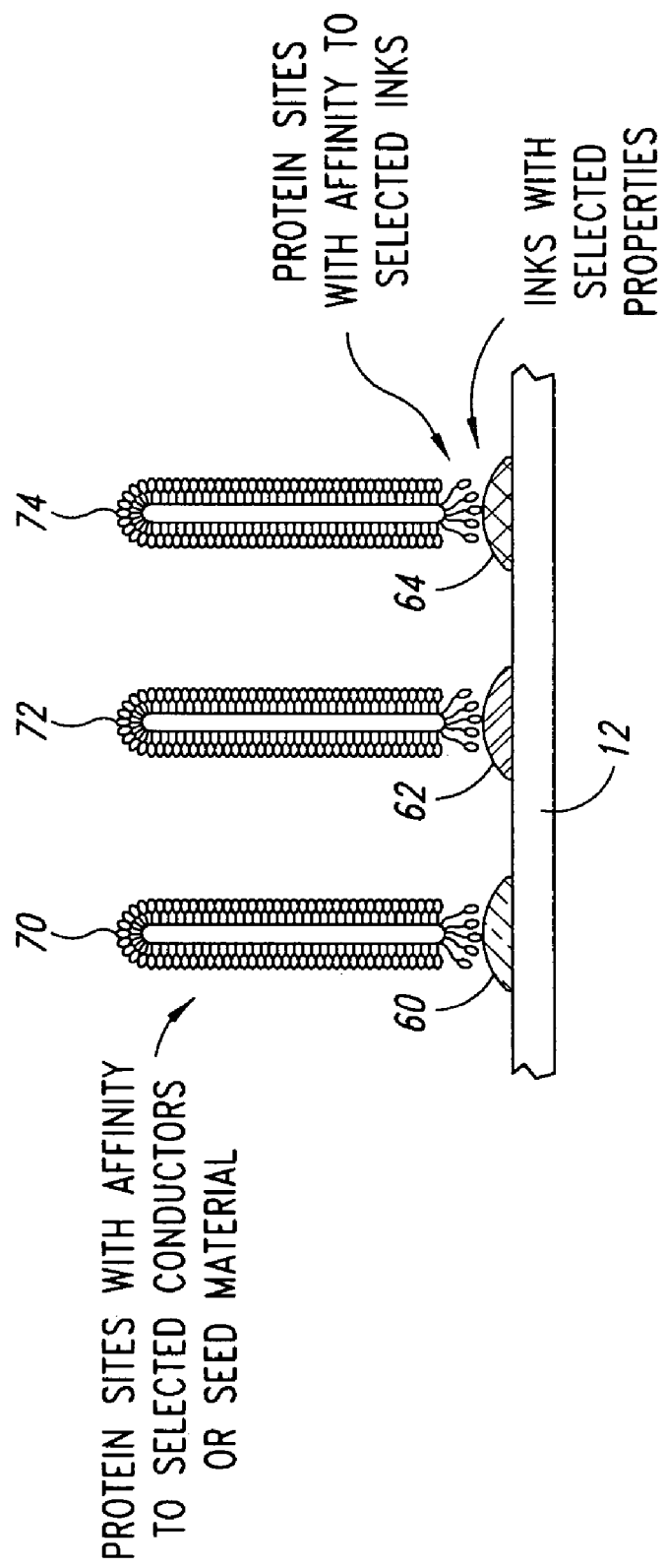
FIG. 14 illustrates a plurality of inks for linking to a respective plurality of different proteins.

FIG. 14 illustrates some advantages of ink printing of the selected pattern according to the present invention. A plurality of inks having selected properties may be easily printed onto substrate 12. A plurality of inks 60, 62, 64 may be printed on the substrate 12. Each of the inks 60, 62, 64 have different properties which will provide an affinity to a different desired protein, 70, 72 and 74. The inks may have slightly different pH characteristics, be composed of different components, or have other properties by which they form an affinity with different biomolecules. Once the substrate 12 is printed with the different inks, the substrate is exposed to a fluid which contains one or more of the different biomolecules. Since each of the biomolecules 70, 72, 74 has an affinity for the particular ink, all of the biomolecules may be contained in a single solution so that only a single exposure is required in order to form three different layers composed of different biomolecule strings. Each of the biomolecules of the different layers has an affinity for a different electronic component. The entire substrate 12 may thereafter be dipped into a solution which contains the precursors to a plurality of different electronic components. The precursors will cause the electrical component to be formed on those particular biomolecules for which they have an affinity but not formed on the other biomolecules for which they do not have an affinity. Accordingly, a wide variety of different layers may be easily printed in a single exposure to a fluid.

Figure 15:
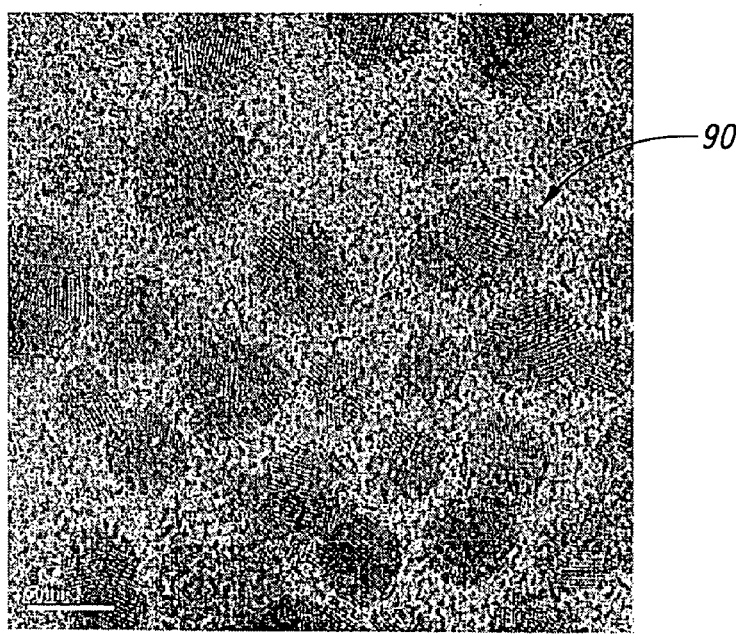
FIG. 15 illustrates a seed layer composed of a peptide and a gold nanoparticle.

FIGS. 15-18 illustrate specific examples of forming electrical conductive circuits and components thereof as carried out according to principles of the invention. FIG. 15 shows the Au nanoparticles stabilized by a peptide to form a seed layer. In the example shown in FIG. 15, a peptide having an affinity for a metal, in the example shown, gold, were combined to form the material at the seed layer. After this, the seed layer was printed with a standard inkjet printer so as to provide the seed layer as illustrated in FIG. 15. The seed layer was printed on Corning 1737 glass under the following conditions, as will now be explained in detail.

Peptides were diluted 1:50 into Au nanoparticle solution to form a 100 μM final concentration of peptide. The mixture was allowed to incubate at room temperature for 30 minutes. The solution was then concentrated by centrifugation at 14,000 r.p.m., and the supernatant was removed. The excess free peptide was then removed and buffers (or water) exchanged using NAP-5 size exclusion purification exchange columns as supplied.

On a Corning 1737 glass substrate (6×6 nm) was adsorbed 5 mM Streptavidin in 100 mM Hepes (pH 7.5). The streptavidin was soaked with the glass chips in an Eppendorf tube, for 1 hour with gentle rocking. Each glass substrate was washed twice with deionized water. A seed layer of nanoparticles was then added to the substrate through a streptavidin (surface)-biotin (peptide) interaction. A 1:5 dilution of size exclusion gel filtered nanoparticles in water (originally formed from 2 mM $HAuCl_4$, gold nanoparticles formed using biotinylated peptide 2 & peptide 3) was incubated for 30 minutes on the glass substrate to bind the Au nanoparticles forming the seed layer. The layer was rinsed with DI water. The seed layer on glass was then incubated for 5 minutes with an electroless plating (ELP) solution (GoldEnhance), forming a metal film. The film was washed with DI water, then an optional second ELP step was performed by pipetting 50 gel of solution onto the 1737 glass chips. The film was again rinsed with DI water, then imaged by AFM and optical microscopy.

Grain size analysis of these images, reveal an increase in grain size after the second ELP step. These images combined show a biologically directed Au thin film.

The film did not grow without the seed layer or the peptide.

Figure 16:
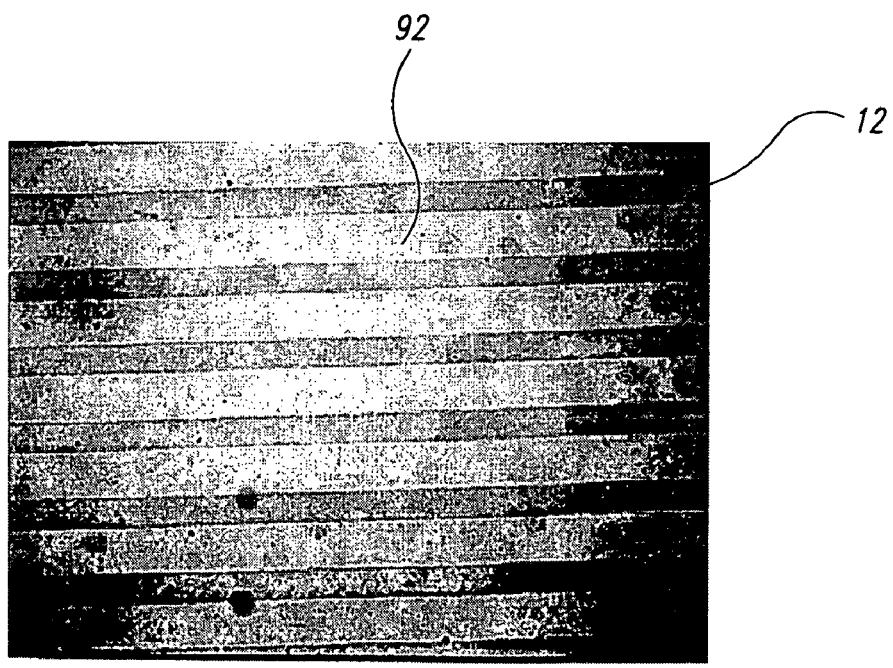
FIG. 16 illustrates printed lines of a seed layer according to principles of the present invention.

As shown in FIG. 9, a biological seed layer is printed having a biomolecule combined with an inorganic biomolecule. Placement of the peptide coated nanocrystals directly on the glass substrate was performed using a microcontact printing approach. A polydimethylsiloxane (PDMS) stamp was prepared by incubation with gold nanoparticles synthesized with biotinylated Peptide 2 (1:5 dilution) for 1 hour (peptide 2 exhibits a high affinity toward glass). The stamp was then rinsed with water and dried with nitrogen. The Au nanoparticle laden stamp was then printed onto a glass microscope slide and imaged via optical microscopy. When the glass substrate was imaged with the printed seed layer, the pattern conveyed by the stamp was immediately apparent as shown in FIG. 16.

The glass substrate with the printed substrate was further processed by one application (15 minutes) of the electroless plating solution (GoldEnhance). The gold film was clearly present and visible, as shown on the far right image in FIG. 16. Optical microscopy images of the electroplated pattern (images left, FIG. 16) show clear resolution of the printed pattern. One interesting point is that the resolution of the seed was preserved in the subsequent plating experiments, at least to the degree to which the line widths could be measured. Further analysis of the patterned film by AFM revealed a gold film thickness of 130.5 nm.

Figure 17:
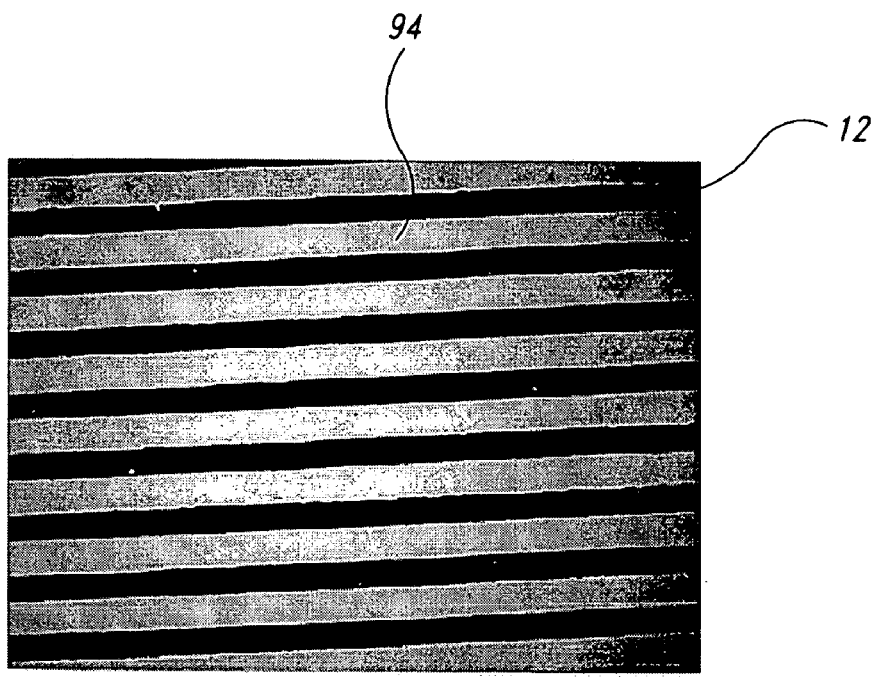
FIGS. 17 and 18 show copper layers formed on printed seed layers on a substrate according to the present invention.
Figure 18:
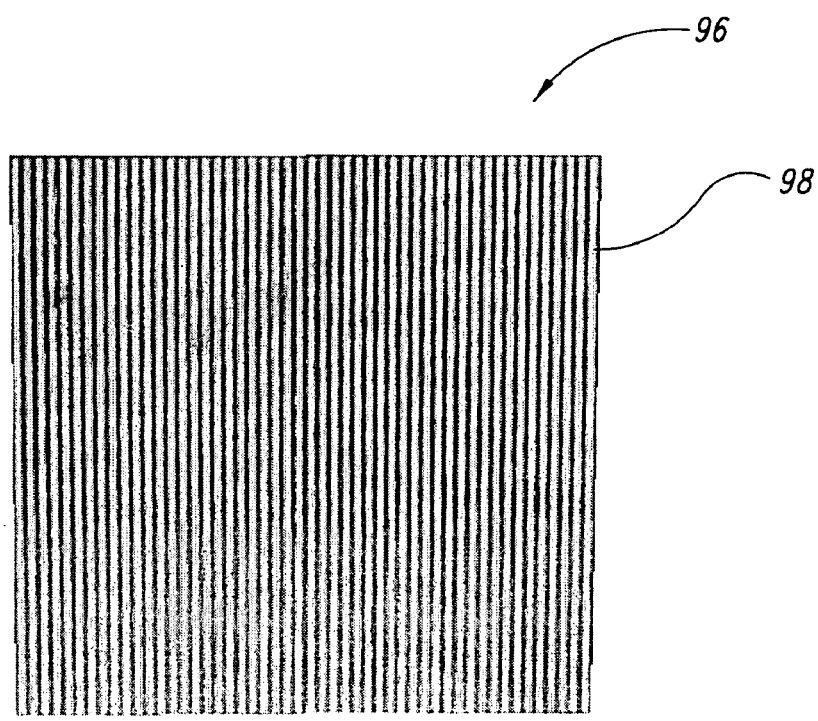

FIGS. 17 and 18 show a copper pattern printed on a glass substrate using a seed layer according to principles of the present invention. The same printed Au-peptide 2 was also used as a seed layer to form a copper film by electroless plating using the transcene pH 13 solution.

A wide variety of seed layers may be used to form a copper film. For example, in one embodiment palladium nanoparticles were synthesized in the presence of a biomolecule peptide. The peptide was thus coated with Pd nanoparticles that were printed on glass substrates which were coated with a Polylycine or with a Streptavidin. Two different copper-containing solutions were available in which the substrate was placed. Various parameters were modified including the pH of the solution, ranging from a pH of 13 to a pH of 9. Other parameters also varied during the formation of the copper material on the seed layer, including the time, the temperature, the agitation, the post-deposition glass substrate cleaning, and the selection of various peptides to bond with the Pd nanoparticle as part of the seed layer. Where no seed layer was present, the copper film was not formed. In all those positions where a seed layer had been printed, a copper layer was formed and grew on the Pd seed layer. It was found that time and temperature did play a role in the thickness, adhesive properties, and the grain structure of the copper film as formed.

FIG. 18 shows that Cu films were fabricated by incubating a Corning 1737 glass substrate with Au nanoparticle (Peptide 2 stabilized) solution for ten minutes forming a seed layer on the glass. The seed layer was then annealed for 20 minutes at 200° C. This process gives a very dense seed. This seed layer, both pre- and post-annealing step was studied by Atomic Force Microscopy. Analysis of surface area roughness shows that annealing does not change the structure of the seed layer, although the resultant Cu film grows better on an annealed seed layer, it is believed that annealing strengthens seed layer adherence to the substrate in preparation for the high pH electroless plating step.

A Cu film was then grown on the annealed seed layer using a copper electroless plating solution (Transene) for 2.5-4 minutes.

Film thickness and resistivity measurements were then measured by atomic force microscopy and a four point probe station. Thicknesses measured were 70 nm and 100 nm. Resistivity measurements taken were 14 $\mu\Omega$-cm and 10 $\mu\Omega$-cm. Since a four point probe station was used, the resultant measurements may differ slightly due to edge effects.

During these experiments, differing purification processes of the Au nanoparticles used were performed to see if the seed layer influenced the resultant Cu film that was ultimately grown. Copper films were still formed when using Au nanoparticles that had been purified by ultra-filtration prior to introduction to the glass substrate.

Additionally, this Cu film growth on a Au seed layer was tried on a TaN substrate, as opposed to the Corning glass substrate as has been demonstrated so far. The TaN was 100 nm thick and was deposited as a film on $SiO_2$ by sputtering at −50° C. Sputtering of TaN was done by reactive sputtering of Ta in nitrogen gas. The composition of the TaN film was approximately 75% Ta/25% N. The TaN was used as supplied and was incubated for 20 minutes with Au (Peptide 2) nanoparticle solution in 0.1× PBS. The resultant seed layer was then annealed at 200° C. for 20 minutes. A Cu film (FIG. 16) was then grown on the seed layer using an electroless plating solution (Transene) for 3.5 minutes.

AFM analysis of the Cu film grown on TaN was performed. Section analysis of the film showed a thickness of 85 nm. Surface roughness analysis showed a roughness of 4 nm, similar to films grown on glass.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An electrical circuit having a plurality of passive components comprising:
    a substrate;
    a first seed layer positioned on the substrate in a selected pattern, the first seed layer having an affinity for a first preselected electrical material;
    a first electrical circuit component composed of the first preselected electrical material coupled to the substrate at the locations containing the seed layer and forming portions of the electrical circuit;
    a second seed layer positioned on the substrate, the second seed layer being positioned adjacent to the first seed layer at a plurality of locations on the substrate and having an upper surface with an affinity for a second preselected electrical material;
    a second electrical circuit component composed of the second preselected electrical material coupled to the substrate at the locations containing the second seed layer and being electrically coupled to the first electrical circuit component at those locations where the first and second seed layers are positioned adjacent to each other, the first and second electrical circuit components forming two different passive components in the electrical circuit, wherein the first seed layer is a first biomolecule and the second seed layer is a different, second biomolecule.

2. The electrical circuit according to claim 1 wherein the first electrical circuit component has a high conductivity to act as conductive trace in the electrical circuit and the second electrical circuit component has a relatively low conductivity, to act as a resistor in the electrical circuit, the first and second seed layers being positioned sufficiently close that the first and second electrical circuit components are in electrical contact with each other to form an electrical circuit having conductors and resistors electrically coupled to each other.

3. The electrical circuit according to claim 1 wherein the selected pattern of the first seed layer is selected to form a first plate of a capacitor and the selected pattern of the second seed layer is selected to form a second plate of the capacitor.

4. A device comprising:
    a substrate,
    a seed layer disposed at selected locations printed on the substrate, wherein the seed layer comprises nanoparticles and a peptide, and
    a conductive film disposed on the seed layer.

5. The device according to claim 4, wherein the peptide comprises at least one binding moiety for binding the nanoparticles.

6. The device according to claim 4, wherein the peptide comprises at least one binding moiety for binding the nanoparticles and is also linked with a binding moiety for the substrate.

7. The device according to claim 4, wherein the peptide comprises at least one binding moiety for binding the nanoparticles and is also linked with a binding moiety for the substrate; wherein the nanoparticles are metallic nanoparticles and have an average particle size of about 200 nm or less; and wherein the seed layer is patterned.

8. The device according to claim 4, wherein the peptide comprises at least one peptide binding moiety for binding the nanoparticles and is also linked with a peptide binding moiety for the substrate; wherein the nanoparticles are metallic nanoparticles and have an average particle size of about 10 nm or less; and wherein the substrate comprises a trench or a via and the seed layer is a conformal coating over the substrate.

9. The device according to claim 4, wherein the seed layer comprises metallic nanoparticles and the peptide comprises at least one binding moiety for binding the metallic nanoparticles.

* * * * *